United States Patent
Eldin et al.

[11] Patent Number: 6,048,667
[45] Date of Patent: Apr. 11, 2000

[54] HETEROGENEOUS PHOTO-INITIATORS, PHOTOPOLYMERIZABLE COMPOSITIONS AND THEIR USE

[75] Inventors: Sameer Hosam Eldin, Courtepin; Peter Grieshaber, Zumholz; François Rime, Marly; Kurt Dietliker, Fribourg, all of Switzerland

[73] Assignee: Ciba Specialty Chemicals Corp., Tarrytown, N.Y.

[21] Appl. No.: 08/983,052
[22] PCT Filed: Jul. 8, 1996
[86] PCT No.: PCT/EP96/02988
   § 371 Date: Jan. 15, 1998
   § 102(e) Date: Jan. 15, 1998
[87] PCT Pub. No.: WO97/04361
   PCT Pub. Date: Feb. 6, 1997

[30] Foreign Application Priority Data

Jul. 19, 1995 [CH] Switzerland ............... 2130/95

[51] Int. Cl.⁷ ............... G03C 1/725; B32B 5/16; C08F 2/46
[52] U.S. Cl. ............... 430/281.1; 430/138; 430/923; 522/35; 428/403; 428/407
[58] Field of Search ............... 428/402.24, 403, 428/404, 406, 407; 522/35; 430/281.1, 138, 923

[56] References Cited

U.S. PATENT DOCUMENTS 4,788,125  11/1988  Davis et al. ............... 430/138
4,922,004  5/1990   Köhler et al. ............. 560/221
5,100,987  3/1992   Hotton et al. ............. 526/313
5,506,279  4/1996   Babu et al. ............... 522/34
5,532,112  7/1996   Köhler et al. ............. 430/281.1
5,712,339  1/1998   Guerin et al. ............. 524/515

FOREIGN PATENT DOCUMENTS 0217205  4/1987   European Pat. Off. .
0281941  9/1988   European Pat. Off. .
9510552  4/1995   WIPO .

OTHER PUBLICATIONS

Polymers for Advanced Technologies, vol. 5, pp. 98–104, (1994).
Polymers for Advanced Technologies, vol. 5, pp. 297–308 (1994).
Radiation Curing of Polymeric Materials, (1990) pp. 106–124.
Koehler et al., "Coreactive Photoinitiators for Surface Polymerization", pp. 106–124, 1990.
VIII Macromolecular UV Photoinitiators, pp. 204–226, pp. 147–148 & p.311.

*Primary Examiner*—Janet Baxter
*Assistant Examiner*—Rosemary Ashton
*Attorney, Agent, or Firm*—Michele A. Kovaleski

[57] ABSTRACT

Heterogeneous photoinitiator in microparticle form, which consists of a finely divided substrate material to which identical or different photoinitiators are covalently bonded. The photoinitiators are suitable for the radiation-induced polymerization of photopolymerizable or photocrosslinkable monomers for the production of moldings, protective coats and relief images.

61 Claims, No Drawings

HETEROGENEOUS PHOTO-INITIATORS, PHOTOPOLYMERIZABLE COMPOSITIONS AND THEIR USE

The present invention relates to a substrate material in microparticle form with covalently bonded, identical or different photoinitiators; to a composition of at least one photopolymerizable or photocrosslinkable monomer and the substrate material; to polymers formed from these compositions; to a substrate coated with the composition; to a substrate having a protective coat or a relief image formed from the polymerized composition; to a process for photopolymerizing monomers; and to the use of the substrate material as photoinitiators.

N. Sasa et al. describe, in Polymers for Advanced Technologies, Volume 5, pages 98 to 104 (1994), UV-sensitive photopolymerizable systems which in addition to the photopolymerizable monomer and the photoinitiator dissolved therein include an ionogenic, crosslinked microgel. The photosensitivity of these systems is said to be higher in comparison to homogeneous systems without microgel. The systems can be used for the lithographic production of printing plates.

In Polymers for Advanced Technologies, Volume 5, pages 297 to 308 (1994) N. Sasa et al. mention that the photosensitivity of these systems can be increased further if the microgels contain ethylenically unsaturated groups bonded ionogenically or covalently.

These compositions in the course of coating, in comparison to pure solutions, have the advantage that their flowability is reduced, so that they are easier to handle from an applications standpoint and can be masked off with plastic films formed, for example, from polyvinyl alcohol in order to protect against instances of contamination prior to exposure to light. It is generally perceived to be a disadvantage that the photoinitiator must be dissolved in the monomers, as is also the case with macromolecular photoinitiators. Such photoinitiators are described, for example, by K. K. Dietliker in Chemistry & Technology of UV & EB Formulation for Coatings, Inks and Paints, Volume 3: Photoinitiators for Free Radical and Cationic Polymerisation, 1991 (Published by SITA Technology Ltd, London).

M. Köhler et al. describe, in Radiation Curing of Polymeric Materials; Hoyle, C. E., Kinstle J. F., Editors; American Chemical Society: Washington, D.C., pages 106 to 124 (1990), that functionalized α-hydroxyacetophenones can be immobilized on commercial silica gel. This silica gel has particle sizes in the millimetre range. In photopolymerization studies it was found that polymers are formed exclusively on the surface of the modified silica gel and that mass polymerization of an ethylenically unsaturated monomer presentis not possible.

It has now surprisingly been found that the dissolving of the photoinitiators can be avoided completely and that it is possible to use photoinitiators in heterogeneous form if they are employed as microparticles with covalently bonded photoinitiators. It has additionally been surprisingly found that these heterogeneous photoinitiators have an excellent sensitivity to light, which is generally even higher than in the systems described by N. Sasa, or systems with dissolved photoinitiators. These heterogeneous photoinitiators also have advantages from the standpoints of operational hygiene and use, since they are storage-stable, non-dusting and free-flowing products which can be processed without problems to form photopolymerizable compositions, often even without the use of a surfactant. The sensitivity to light can, surprisingly, be increased still further if the microparticles additionally comprise ionogenically or covalently bonded, ethylenically unsaturated groups.

A first subject of the invention is therefore a heterogeneous photoinitiator in microparticle form, which consists of a finely divided substrate material to which identical or different photoinitiators are covalently bonded.

Heterogeneous in the context of the invention means that the photoinitiators are insoluble or only swellable in the photopolymerizable or photocrosslinkable compositions. Swellable finely divided substrate materials are also referred to as microgels or emulsion polymers (latex), and are preferred in the context of the present invention.

Microparticles in the context of the invention means a mean particle size of preferably from 2 to 1000 nm, more preferably from 5 to 500 nm, still more preferably from 5 to 300 nm, with particular preference from 5 to 200 nm, and with especial preference from 5 to 100 nm. The particles can have a circular or irregular form, depending on their preparation process.

In the case of the photoinitiators a distinction may be made between two embodiments, namely (A) polymers formed from monomers with covalently bonded photoinitiators and, optionally, comonomers, and (B) inorganic or organic substrate materials modified subsequently on the surface, with covalently bonded photoinitiators and, optionally, covalently bonded sensitizers, coinitiators or polymerizable groups. The details below relate to the embodiment (A), which relative to the polymers of embodiment (B) offers the advantage of lower consumption of photoinitiator, since the latter is not partly taken into the microparticles by polymerization.

The substrate material can comprise inorganic or organic substrate materials. The substrate material can be opaque, translucent or transparent. Preference is given to transparent substrate materials. Opaque and/or translucent substrate materials can be employed, for example, in the preparation of thin coats. Suitable substrate materials are, for example, plastics, glass, ceramics, minerals, rocks, metal oxides, metal nitrides, metal carbides, metals and metal alloys. For bonding the photoinitiators, the substrate materials include functional groups which—if necessary—can be generated in a simple manner by plasma treatment, in a reactive gas atmosphere if desired. Preferred substrate materials are plastics, for example polymers with functional groups or subsequently surface-modified polymers for introducing functional groups for the covalent bonding of the photoinitiators.

In the case of the inorganic substrate materials the functional groups comprise preferably amine groups and, with particular preference hydroxyl groups. These functional groups are in general provided with anchor groups to which the photoinitiators are bonded directly or by way of a bridging group. Preferred for this purpose are silanes having a functional group, for example tri-($C_1$–$C_4$alkoxy)Si—$(CH_2)_p$—$NH_2$, tri-($C_1$–$C_4$alkoxy)Si—$(CH_2)_p$—OH, tri-($C_1$–$C_4$alkoxy)Si—$(CH_2)_p$—NH—$CH_2CH_2$—$NH_2$, tri-($C_1$–$C_4$alkoxy)Si—$(CH_2)_p$—C(O)OH, tri-($C_1$–$C_4$alkoxy)-(prop-1-en-3-yl)silane, tri-($C_1$–$C_4$alkoxy)-glycidoxysilane or tri-($C_1$–$C_4$alkoxy)Si—$(CH_2)_p$—NCO, where p is a number from 2 to 12, preferably 2 to 6 and with particular preference 2 to 4. Some examples are γ-aminopropyltrimethoxy- or -triethoxysilane, γ-hydroxypropyltrimethoxy- or -triethoxysilane and 2-trimethoxy- or 2-triethoxysilylpropionic acid.

In the case of the organic substrate materials, the functional groups are preferably amine, hydroxyl, carboxyl, —$SO_3H$ or isocyanate groups. The polymers concerned can be subsequently modified (for example by means of plasma treatment) or ground, natural or synthetic polymers having functional groups. Also suitable as synthetic polymers are emulsion polymers and latices formed from at least one monomer having functional groups. Examples of natural polymers are polysaccharides such as cellulose, starch, carrageenan or chitosan, which can be in part etherified with $C_1$–$C_4$alkyl or acylated with $C_1$–$C_8$acyl. Synthetic polymers having functional groups are known in large numbers or can be prepared by analogous processes. Some examples of synthetic polymers are polyvinyl alcohol and copolymers with unsubstituted or substituted olefins as comonomers; polymethacrylic acid, polyacrylic acid and polymaleic acid and copolymers with unsubstituted or substituted olefins as comonomers; polyhydroxyalkyl acrylates, polyhydroxyalkyl methacrylates and polyhydroxyalkyl maleates and copolymers with unsubstituted or substituted olefins as comonomers; polyacrylamides and polymethacrylamides and copolymers with unsubstituted or substituted olefins as comonomers; polyaminoalkyl acrylates, methacrylates and maleates and copolymers with unsubstituted or substituted olefins as comonomers; polyhydroxyalkyl or polyaminoalkyl vinyl alcohol and copolymers with unsubstituted or substituted olefins as comonomers; hydroxylated polybutadienes formed from butadiene, isoprene or chloroprene and copolymers with unsubstituted or substituted olefins as comonomers; hydroxy- or amino polystyrene, chloromethyl polystyrene, and polystyrene sulfonic acid and copolymers with unsubstituted or substituted olefins as comonomers; polyglycidyl ethers and hydroxyalkylated or amino alkylated polyglycidyl ethers; and polyesters, polyamides and polyurethanes with hydroxyl-containing monomers. Also suitable are thermosets, for example epoxy resins, melamine formaldehyde resins and phenol formaldehyde resins. Suitable comonomers are, for example, olefins such as ethene, propene, butene, pentene, octene; vinyl chloride, vinylidene chloride; styrene; and acrylonitrile. Other polymers which come into consideration are crosslinked polymers, for example addition polymers with olefins and diolefinic monomers such as butadiene, divinylbenzene or diol diacrylates or methacrylates. Further suitable vinyl polymers are polyvinylpyrrolidone, polyvinylimidazole and polyvinylpyridine and copolymers with unsubstituted or substituted olefins as comonomers.

The photoinitiator is judiciously bonded covalently to the substrate material by way of a bridging group. The bridging group can contain 1 to 30 atoms, preferably 1 to 20 atoms and, with particular preference, 1 to 12 atoms selected from the group C, O, S and N. The bridging group preferably comprises hydrocarbon radicals which can be interrupted by one or more heteroatoms from the group O, S and N.

In one embodiment of the invention the heterogeneous photoinitiator can, for example, consist of microparticles to whose functional groups on the surface a photoinitiator is covalently bonded directly and, preferably, by way of a bridging group.

The photoinitiator radical attached to the functional groups on the surface can, for example, conform to the formula I

—X$_1$—(R$_1$)$_r$—(X$_2$)$_s$—R$_3$-Phot,     (I)

in which

X$_1$ and X$_2$ independently of one another are a direct bond, or X$_2$ and X$_1$ independently of one another are —O—, —S—, —NR$_2$—, —C(O)—O—, —O—C(O)—, —O—C(O)—O—, —SO$_2$—O—, —O—SO$_2$—, —O—SO$_2$—O—, —NR$_2$—C(O)—, —C(O)—NR$_2$—, —NR$_2$—C(O)—O—, O—C(O)—NR$_2$—, NR$_2$—C(O)—NR$_2$—, —NR$_2$—SO$_2$—, —SO$_2$—NR$_2$—, —NR$_2$—SO$_2$—O—, O—SO$_2$—NR$_2$— or —NR$_2$—SO$_2$—NR$_2$—, R$_1$ is a bivalent bridging group, Phot is a monovalent radical of a photoinitiator, R$_2$ H, $C_1$–$C_{12}$alkyl, $C_5$- or $C_6$cycloalkyl, $C_5$- or $C_6$cycloalkylmethyl or -ethyl, phenyl, benzyl or 1-phenyleth-2-yl, R$_3$ is a direct bond, $C_1$–$C_{18}$alkylene, $C_5$- or $C_6$cycloalkylene, $C_6$–$C_{10}$arylene or $C_7$–$C_{12}$aralkylene, r is the number 0 or 1 and s is the number 0 or 1, and s is 0 if r is 0.

R$_2$ defined as alkyl contains preferably 1 to 6 and with particular preference 1 to 4 C atoms. Some examples are methyl, ethyl, n- or i-propyl, butylhexyl and octyl. R$_2$ defined as cycloalkyl is preferably cyclohexyl, and defined as cycloalkylmethyl is preferably cyclohexylmethyl. In a preferred embodiment R$_2$ is H or $C_1$–$C_4$alkyl.

The bivalent bridging group is preferably a hydrocarbon radical which preferably contains 1 to 30, more preferably 1 to 18, with particular preference 1 to 12 and with even more preference for 1 to 8 C atoms and which is unsubstituted or substituted one or more times by $C_1$–$C_4$alkyl, $C_1$–$C_4$alkoxy or =O. The hydrocarbon radical may also be interrupted one or more times with heteroatoms selected from the group —O—, —S— and —NR—, where R$_2$ is preferably H or $C_1$–$C_4$alkyl.

The bivalent bridging group can, for example, be $C_1C_{20}$-, preferably $C_2$–$C_{12}$alkylene, which can be linear or branched. Some examples are methylene, ethylene, 1,2- or 1,3-propylene, 1,2-, 1,3- or 1,4-butylene, pentylene, hexylene, octylene, dodecylene, tetradecylene, hexadecylene and octadecylene.

The bivalent bridging group can, for example, be polyoxaalkylene having 2 to 12, preferably 2–6 and, with particular preference, 2 to 4 oxaalkylene units and 2 to 4, preferably 2 or 3 C atoms in the alkylene. With particular preference it comprises polyoxaethylene and polyoxapropylene having 2 to 6 oxaalkylene units.

The bivalent bridging group can, for example, be $C_5$–$C_{12}$-, preferably $C_5$–$C_8$- and, with particular preference $C_5$- or $C_6$cycloalkylene such as, for example, cyclopentylene, cyclohexyleneene, cyclooctylene or cyclododecylene.

The bivalent bridging group can, for example, be $C_5$–$C_{12}$-, preferably $C_5$–$C_8$- and, with particular preference $C_5$- or $C_6$cycloalkylene-$C_1$–$C_{12}$- and preferably —$C_1$–$C_4$alkyl. Some examples are cyclopentylene $C_nH_{2n}$- and cyclohexylene $C_nH_{2n}$-, in which n is a number from 1 to 4. Particular preference is given to -cyclohexylene-CH$_2$-.

The bivalent bridging group can, for example, be $C_5$–$C_{12}$-, preferably $C_5$–$C_8$- and, with particular preference, $C_5$- or $C_6$cycloalkylene-$C_1$–$C_{12}$alkyl)$_2$- and preferably (—$C_1$–$C_4$alkyl)$_2$. Some examples are cyclopentylene ($C_nH_{2n}$-)$_2$ and cyclohexylene-($C_nH_{2n}$-)$_2$, in which n is a number from 1 to 4. Particular preference is given to —CH$_2$-cyclohexylene-CH$_2$-.

The bivalent bridging group can, for example be $C_6$–$C_{14}$arylene and preferably $C_6$–$C_{10}$arylene, for example naphthylene or more preferably phenylene.

The bivalent bridging group can, for example, be $C_7$–$C_{20}$aralkylene and preferably $C_7$–$C_{12}$aralkylene. More preferred is arylene-$C_nH_{2n}$-, in which arylene is naphthylene and especially phenylene and n is a number from 1 to 4. Examples are benzylene and phenylene-$C_2h_4$.

The bivalent bridging group can, for example, be arylene-($C_nH_{2n}$-)$_2$- in which arylene is preferably naphthylene and especially phenylene and n is a number from 1 to 4. Examples are xylylene and phenylene(CH$_2$CH$_2$)$_2$-.

R$_3$ contains as alkylene preferably 1 to 12 and with particular preference 1 to 6 C atoms. Particularly preferred examples are methylene, ethylene, 1,2- or 1,3-propylene and 1,2-, 1,3- and 1,4-butylene. R$_3$ as arylene is preferably phenylene and as aralkylene is preferably benzylene.

Monomeric and polymeric photoinitiators have been disclosed in large numbers and are described, for example, by K. K. Dietliker in Chemistry & Technology of UV & EB Formulation for Coatings, Inks and Paints, Volume 3: Photoinitiators for Free Radical and Cationic Polymerisation, 1991 (Published by SITA Technology Ltd, London), or by C. G. Roffey, Photopolymerisation of Surface Coatings, John Wiley & Sons, 1985. They may be free-radical or cationic photoinitiators. The photoinitiators can be used alone or together with sensitizers or coinitiators which can be present dissolved in the photopolymerizable system or bonded covalently to the substrate material.

The photoinitiators from which the radical of formula I is derived can, for example, comprise benzoin, hydroxybenzoin, and hydroxyalkylated benzoin derivatives. They can conform to the formula II

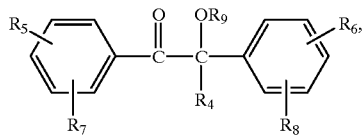

(II)

in which

R$_4$ is H, C$_1$–C$_8$alkyl, C$_1$–C$_6$hydroxyalkyl, cyclohexylene, phenyl or benzyl, R$_9$ is H, C$_1$–C$_8$alkyl, C$_2$–C$_6$hydroxyalkyl or C$_1$–C$_6$carboxylalkyl, and R$_5$, R$_6$, R$_7$ and R$_8$ independently of one another are H, C$_1$–C$_4$-alkyl, C$_1$–C$_4$alkoxy, F or Cl; or R$_4$ is C$_1$–C$_6$hydroxyalkyl or C$_1$–C$_6$carboxylalkyl, R$_9$ is C$_1$–C$_8$alkyl, cyclohexylene, phenyl or benzyl, and R$_5$, R$_6$, R$_7$ and R$_8$ independently of one another are H, C$_1$–C$_4$alkyl, C$_1$–C$_4$alkoxy, F or Cl; or one of R$_5$, R$_6$, R$_7$ and R$_8$ is hydroxyl and the others are H, C$_1$–C$_4$alkyl, C$_1$–C$_4$alkoxy, F or Cl, R$_4$ is H, C$_1$–C$_4$alkoxy, benzyloxy or phenyloxy, and R$_9$ is H, C$_1$–C$_6$alkyl, C$_2$–C$_6$hydroxyalkyl, cyclohexylene, phenyl or benzyl.

R$_4$ and R$_9$ contain as alkyl preferably 1 to 6 and with particular preference 1 to 4 C atoms. Some examples are methyl ethyl, n- and i-propyl, n-, i- and t-butyl. R$_4$ contains as hydroxylalkyl preferably 1 to 4 C atoms and is especially hydroxymethyl. R$_9$ contains as hydroxylalkyl preferably 1 to 4 C atoms and is, for example, 2-hydroxyeth-1-yl, 2-hydroxyprop-1-yl, 3-hydroxyprop-1-yl, 2-hydroxybut-1-yl or 4-hydroxybut-1-yl. Examples of carboxylalkyl are carboxylmethyl, carboxylethyl and carboxylpropyl. R$_5$, R$_6$, R$_7$ and R$_8$ are preferably H.

Some examples, in addition to benzoin, are 4-hydroxybenzoin, benzoin hydroxyethyl ether, methylolbenzoin, methylolbenzoin methyl, ethyl or propyl ether, and carboxylethylbenzoin methyl, ethyl or propyl ether.

The photoinitiators from which the radical of the formula I is derived can, for example, be α-hydroxyalkylphenones. They may conform to formula III

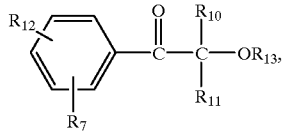

(III)

in which

R$_7$ is H, C$_1$–C$_4$alkyl, C$_1$–C$_4$alkoxy, F, or Cl;

R$_{10}$ and R$_{11}$ independently of one another are C$_1$–C$_{12}$-, preferably C$_1$–C$_8$- and, with particular preference, C$_1$–C$_4$alkyl, C$_5$- or C$_6$cycloalkylene, phenyl or phenyl-C$_1$–C$_4$alkyl, or R$_{10}$ and R$_{11}$ together are —C$_n$H$_{2n}$- and n is a number from 3 to 7, preferably 4 or 5;

R$_{12}$ is H, —OH, —SH, C$_2$–C$_6$hydroxyalkyloxy or C$_2$–C$_6$hydroxyalkylthio; and R$_{13}$ is H, C$_1$–C$_6$alkyl, C$_5$- or C$_6$cycloalkylene, phenyl or benzyl, with the proviso that R$_{12}$ is not H if R$_{13}$ is H, C$_1$–C$_6$alkyl, C$_5$- or C$_6$cycloalkylene, phenyl or benzyl.

Examples of hydroxyalkylphenones are 2-hydroxy-2-methyl-1-phenylpropanone, 2-hydroxy-2-methyl-1-(4'-i-hypropylphenyl)-propanone, 2-hydroxy-2-methyl-1-(4'-hydroxyphenyl)-propanone, 2-hydroxy-2-methyl-1-(4'-i-hypropylphenyl)propanone, 2-hydroxy-2-methyl-1-(4'-hydroxyethoxylphenyl)propanone and 1-hydroxycyclohexylene phenyl ketone.

Other suitable photoinitiators from which the radical of the formula I is derived are, for example, hydroxyl-containing benzil ketals which may conform to the formula IV

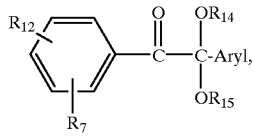

(IV)

in which

R$_7$ is H, C$_1$–C$_4$alkyl, C$_1$–C$_4$alkoxy, F or Cl;

R$_{12}$ is —OH, —SH, C$_2$–C$_6$hydroxyalkyloxy or C$_2$–C$_6$hydroxyalkylthio;

R$_{14}$ and R$_{15}$ independently of one another are C$_1$–C$_6$alkyl, C$_5$- or C$_6$cycloalkylene, phenyl or phenyl-C$_1$–C$_4$alkyl;

R$_{14}$ and R$_{15}$ together are C$_2$–C$_4$alkylene or C$_2$–C$_4$-alkenylene, and Aryl is unsubstituted or C$_1$–C$_4$alkyl-, C$_1$–C$_4$alkoxy-, F- or Cl-substituted naphthyl and especially phenyl.

Some examples of such benzil ketals are 2,2-dimethoxy-2-phenyl-hydroxy- or -mercaptol-acetophenone, 2,2-dimethoxy-2-phenyl-hydroxyethoxy- or -hydroxyethylthioacetophenone, 2,2-diethoxy-2-phenyl-hydroxy- or -mercaptol-acetophenone, 2,2-diethoxy-2-phenyl-hydroxyethoxy- or -hydroxyethylthio-acetophenone and 2-hydroxybenzoyl-2-phenyl-1,3-dioxalan.

Further suitable photoinitiators from which the radical of the formula I is derived are, for example, α-aminoalkylphenones, which contain hydroxyl groups, thiol groups or —NHR$_2$— groups and which may conform to the formula V

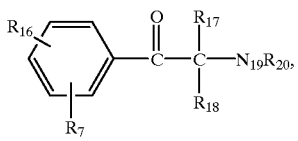

(V)

in which

R$_7$ is H, C$_1$–C$_4$alkyl, C$_1$–C$_4$alkoxy, F or Cl;

R$_{16}$ is —OH, —SH, —NHR$_2$, C$_2$–C$_6$hydroxyalkyloxy or C$_2$–C$_6$hydroxyalkylthio or C$_2$–C$_6$hydroxyalkyl-NR$_2$— and R$_2$ is H, C$_1$–C$_{12}$alkyl, C$_5$- or C$_6$cycloalkylene, C$_5$- or C$_6$cycloalkylenemethyl or -ethyl, phenyl, benzyl or 1-phenyleth-2-yl;

R$_{17}$ and R$_{18}$ independently of one another are C$_1$–C$_{12}$alkyl, C$_5$- or C$_6$cycloalkylene, C$_5$- or C$_6$-cycloalkylenemethyl or -ethyl, phenyl, phenylmethyl or 1-phenyleth-2-yl, where the phenyl groups are unsubstituted or substituted by C$_1$–C$_4$alkyl or C$_1$–C$_4$-alkoxy; and R$_{19}$ and R$_{20}$ independently of one another are C$_1$–C$_{12}$alkyl, C$_2$–C$_6$alkenyl, C$_2$–C$_6$-hydroxyalkyl, C$_5$- or C$_6$cycloalkylene, C$_5$- or C$_6$cycloalkylenemethyl or -ethyl, phenyl, phenylmethyl or 1-phenyleth-2-yl, where the phenyl groups are unsubstituted or substituted by C$_1$–C$_4$alkyl or C$_1$–C$_4$- alkoxy, or R$_{19}$ and R$_{20}$ together are —(CH$_2$)$_4$—, —(CH$_2$)$_5$- , —CH$_2$CH$_2$—O—CH$_2$CH$_2$— or —CH$_2$CH$_2$—NR$_2$—CH$_2$CH$_2$—; and R$_2$ is H, C$_1$–C$_{12}$alkyl, C$_2$–C$_6$hydroxyalkyl, C$_5$- or C$_6$cycloalkylene, C$_5$- or C$_6$cycloalkylenemethyl or -ethyl, phenyl, benzyl or 1-phenyleth-2-yl.

Some examples of such α-aminoalkylphenones are 2-methyl-1-[4-hydroxyphenyl]-2-dimethylamino-propan-2-one, 2-methyl-1-[4-thiolphenyl]-2-dimethylamino-propan-2-one, 2-methyl-1-[4-aminophenyl]-2-dimethylamino-propan-2-one, 2-methyl-1-[4-hydroxyphenyl]-2-morpholino-propan-2-one, 2-methyl-1-[4-thiophenyl]-2-morpholino-propan-2-one, methyl-1-[4-aminophenyl]-2-morpholino-propan-2-one, 2-methyl-1-[4-(hydroxyethoxy)phenyl]-2-dimethylamino-propan-2-one, 2-methyl-1-[4-(hydroxyethylthio)phenyl]-2-dimethylamino-propan-2-one, 2-methyl-1-[4-(hydroxyethylamino)phenyl]-2-dimethylamino-propan-2-one, 2-methyl-1-[4-(hydroxyethoxy)phenyl]-2-morpholino-propan-2-one, 2-methyl-1-[4-(hydroxyethylthiophenyl]-2-morpholino-propan-2-one and methyl-1-[4-(hydroxyethylamino)phenyl]-2-morpholino-propan-2-one.

Other suitable free-radical photoinitiators with functional groups can be selected from the group of the acylphosphine oxides, α-hydroxyl imine ketones, organic peroxo compounds, halogenated acetophenones, phenylglyoxylates, thioxanthones, xanthones, anthraquinones, naphthacenequinones and α-arylthioacetophenones. Furthermore, cationic photoinitiators such as, for example, photochemically deblockable Lewis acids and onium salts with functional groups can also be used for covalent bonding to substrate materials. The amount of the photoinitiators bonded covalently to the substrate material can, for example, be from 0.0001 to 100, preferably from 0.1 to 100, more preferably from 1 to 90, with particular preference from 2 to 80 and with especial preference from 20 to 80% by weight, based on the substrate material.

In order to increase the sensitivity to light, photoinitiators are often employed in combination with other initiators or together with sensitizers.

To increase the sensitivity, photoinitiators can be used together with sensitizers or coinitiators. In one preferred embodiment of the invention the sensitizers and coinitiators are bonded covalently to the substrate material by way of functional groups. Known sensitizers and coinitiators are, for example, xanthones, anthraquinones, naphthacenequinones, thioxanthones, ethanolamines, aminobenzoic acids and Michler's ketone. Such functionalized sensitizers and coinitiators are known in large numbers and are therefore not specified further here. For the immobilization, the above-described bridging groups and functional groups come into consideration.

The amount of the covalently bonded sensitizers or coinitiators can, for example, be from 0.0001 to 99.9999, preferably from 0.1 to 100, more preferably from 1 to 90, with particular preference from 2 to 80 and with especial preference from 20 to 80% by weight, based on the substrate material.

In one preferred embodiment there are additionally bonded ionogenically or covalently to the substrate material free-radically or cationically photopolymerizable organic compounds which preferably correspond to the type of organic compounds used in the polymerizable composition. In free-radically polymerizable ethylenically unsaturated systems, accordingly, use is made advantageously of ethylenically unsaturated compounds having functional groups, and in cationically polymerizable systems such as, for example, di- or polyepoxides use is made judiciously of di- or polyepoxides having functional groups.

Preference is given to ethylenically unsaturated organic compounds having functional groups, which are known in large numbers. The radicals of ethylenically unsaturated organic compounds that are attached covalently to the substrate material can, for example, conform to the formula VI

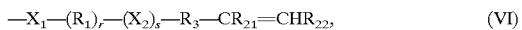   (VI)

in which

X$_1$ and X$_2$ independently of one another are a direct bond, or X$_2$ and X$_1$ together with the functional group independently of one another are —O—, —S—, —NR$_2$—, —C(O)—O—, —O—C(O)—, —O—C(O)—O—, —SO$_2$—O—, —O—SO$_2$—, —O—SO$_2$—O—, —NR$_2$—C(O)—, —C(O)—NR$_2$—, —NR$_2$—C(O)—O—, O—C(O) NR$_2$—, —NR$_2$—C(O)—NR$_2$—, —NR$_2$—SO$_2$—, —SO$_2$—NR$_2$—, —NR$_2$—SO$_2$—O—, O—SO$_2$—NR$_2$— or —NR$_2$—SO$_2$—NR$_2$—, R$_1$ is a bivalent bridging group, R$_2$ is H, C$_1$–C$_{12}$alkyl, C$_5$- or C$_6$cycloalkylene, C$_5$- or C$_6$cycloalkylenemethyl or -ethyl, phenyl, benzyl or 1-phenyleth-2-yl, R$_3$ is a direct bond, C$_1$–C$_{18}$alkylene, C$_5$- or C$_6$cycloalkyleneene, C$_6$–C$_{10}$arylene or C$_7$–C$_{12}$aralkylene, r is the number 0 or 1 and s is the number 0 or 1, and s is 0 if r is 0;

R$_{21}$ is H or C$_1$–C$_4$alkyl, especially methyl; and

R$_{22}$ is H, C$_1$–C$_{12}$alkyl, phenyl or benzyl.

X$_1$, X$_2$, R$_1$, R$_2$ and R$_3$ are subject to the preferences set out in the case of formula I. R$_{21}$ is preferably H or methyl, and R$_{22}$ is preferably H.

Examples of ethylenically unsaturated compounds containing functional groups are ethylenically unsaturated alcohols, amines and isocyanates such as, for example, allyl alcohol, allylamine, allyl isocyanate, crotonyl alcohol; monoesters or monoamides of dicarboxylic acids and unsaturated alcohols and amines; functional,styrenes such as, for example, chloromethylstyrene, hydroxystyrene, hydroxyethoxystyrene, styreneamine, styrene-hydroxyethylamine, styrenecarboxylic acid, styrenesulfonic acid, vinyl hydroxyethyl ether, acrylic acid, methacrylic acid, acryl- and methacrylamide, acrylic and methacrylic acid $C_2$–$C_6$-hydroxyalkyl amide, acrylic and methacrylic acid $C_2C_6$-hydroxyalkyl ester.

The amount of the ionogenically or covalently bonded, free-radically or cationically photopolymerizable organic compounds can be for example from 0,0001 to 99,9999, preferably from 0,1 to 100, more preferably from 1 to 90, with particular preference from 2 to 80 and with especial preference from 20 to 80% by weight, based on the substrate material.

The percentages by weight add up to 100%.

The immobilization can be carried out by generally known techniques. In this context it is also possible, in principle, to transform existing functional groups into other functional groups, for example —$CH_2OH$ groups by oxidation into carboxylic acids, carboxylic acids into amides or halides, amine groups into isocyanate groups, alcohols or amines into carbonates or urethanes. It is possible, furthermore, to react alcohols or amines first with halocarboxylic acids (for example chloroacetic acid). Chain extenders, such as, for example, epoxides, azirine, diols, diamines, dicarboxylic acids or esters and diisocyanates, can also be employed one or more times in succession and thus the length of the bridging group can be determined in a defined manner. These methods and techniques for immobilization are known and are described in the technical literature. In this context, the bridging group can be built up starting from the substrate material or from the functional compound. The subsequent reaction with the functional compound or with the substrate material leads to the heterogeneous photoinitiators of the invention. The reactions can be carried out with customary inert organic solvents and at temperatures from 0 C to 200 C.

The comments below relate to the embodiment (B).

In another preferred embodiment of the invention the heterogeneous photoinitiator comprises polymers to whose polymer backbone monovalent radicals of identical or different photoinitiators are covalently bonded, directly or by way of a bridging group.

Polymeric photoinitiators have been disclosed in large numbers and are described, for example, by K. K. Dietliker in Chemistry & Technology of UV & EB Formulation for Coatings, Inks and Paints, Volume 3: Photoinitiators for Free Radical and Cationic Polymerisation, pages 204 to 227 (1991) (Published by SITA Technology Ltd, London). The macromolecular photoinitiators are soluble in the photopolymerizable compositions. Insoluble heterogeneous photoinitiators for mass polymerization have not hitherto been described.

The polymers can consist of monomer units with monovalent radicals of a photoinitiator and, if desired, comonomer units. The photoinitiator can be attached to the monomer directly or by way of a bridging group and, in addition, spacer groups. The bridging groups are derived from functional groups that are attached to the monomer (or to the polymer).

In the case of the polymers the functional groups are preferably amine, hydroxyl, carboxyl, —$SO_3H$ or isocyanate groups. The polymers concerned can be ground natural or synthetic polymers having functional groups. Also suitable as synthetic polymers are emulsion polymers and latices formed from at least one monomer having functional groups. Examples of natural polymers are polysaccharides such as cellulose, starch, carrageenan or chitosan, which can be in part etherified with $C_1$–$C_4$alkyl or acylated with $C_1$–$C_8$acyl. Synthetic polymers having functional groups are known in large numbers or can be prepared by analogous processes. Some examples of synthetic polymers are polyvinyl alcohol and copolymers with unsubstituted or substituted olefins as comonomers; polymethacrylic acid, polyacrylic acid and polymaleic acid and copolymers with unsubstituted or substituted olefins as comonomers; polyhydroxyalkyl acrylates, polyhydroxyalkyl methacrylates and polyhydroxyalkyl maleates and copolymers with unsubstituted or substituted olefins as comonomers; polyacrylamides and polymethacrylamides and copolymers with unsubstituted or substituted olefins as comonomers; polyaminoalkyl acrylates, methacrylates and maleates and copolymers with unsubstituted or substituted olefins as comonomers; polyhydroxyalkyl or polyaminoalkyl vinyl alcohol and copolymers with unsubstituted or substituted olefins as comonomers; hydroxylated polybutadienes formed from butadiene, isoprene or chloroprene and copolymers with unsubstituted or substituted olefins as comonomers; hydroxy- or amino polystyrene, chloromethypolystyrene, and polystyrenesulfonic acid and copolymers with unsubstituted or substituted olefins as comonomers; polyglycidyl ethers and hydroxyalkylated or amino alkylated polyglycidyl ethers; and polyesters, polyamides and polyurethanes with hydroxyl-containing monomers. Further suitable polymers are polyvinylpyridine, polyvinylimidazole and polyvinylpyrrolidone and copolymers with unsubstituted or substituted olefins as comonomers.

Preference is given to polymers based on functionally substituted, ethylenically unsaturated monomers.

In one preferred embodiment the polymers of the invention contain from 100 to 0.1 mol-% of identical or different structural units of the formula VII,

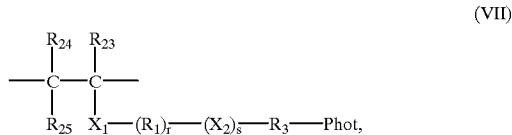

(VII)

and from 0 to 99.9 mol-% of identical or different structural units of the formula VIII

(VIII)

in which $X_1$ and $X_2$ independently of one another are a direct bond, or $X_2$ and $X_1$ together with the functional group independently of one another are —O—, —S—, —$NR_2$—, —C(O)—O—, —O—C(O)—, —O—C(O)—O—, —$SO_2$—O—, —O—$SO_2$—, —O—$SO_2$—O—, —$NR_2$—C(O)—, —C(O)—$NR_2$—, —$NR_2$—C(O)—O—, O—C(O)—$NR_2$—,
—$NR_2$—C(O)—$NR_2$—, —$NR_2$—$SO_2$—, —$SO_2$—$NR_2$—, —$NR_2$—$SO_2$—O—, O—$SO_2$—$NR_2$— or —$NR_2$—$SO_2$—$NR_2$—, $R_1$ is a bivalent bridging group, Phot is a monovalent radical of a photoinitiator, $R_2$ is H, $C_1$–$C_{12}$alkyl, $C_5$- or $C_6$cycloalkylene, $C_5$- or $C_6$cycloalkylenemethyl or -ethyl, phenyl, benzyl or 1-phenyleth-2-yl, $R_3$ is a direct bond, $C_1$–$C_{18}$alkylene, $C_5$- or $C_6$cycloalkyleneene, $C_6$–$C_{10}$arylene or $C_7$–$C_{12}$aralkylene, r is the number 0 or 1 and s is the number 0 or 1, and s is 0 if r is 0, $R_{23}$ and $R_{24}$ independently of one another are H, $C_1$–$C_6$alkyl, $C_6$–$C_{10}$aryl or $C_7$–$C_{12}$aralkyl, $R_{25}$ is H or the group —C(O)O—$R_{30}$, $R_{26}$ is H, $C_1$–$C_6$alkyl, $C_6$–$C_{10}$aryl or $C_7$–$C_{12}$aralkyl, $R_{27}$ is H, F, Cl, CN, $C_1$–$C_6$alkyl or $C_6$–$C_{10}$aryl, $R_{28}$ is H, $C_1$–$C_6$alkyl or —C(O)O—$R_{29}$.

$R_{29}$ is H, $C_1$–$C_6$alkyl, $C_6$–$C_{10}$aryl, $C_7$–$C_{12}$aralkyl, imidazolyl, pyrrolidonyl, F, Cl, CN or the group $X_1$—$(R_1)_r$—$(X_2)_s$—H, and $R_{30}$ is H, K, Na, $C_1$–$C_{18}$alkyl, $C_1$–$C_{18}$hydroxyalkyl, cyclohexylene, cyclopentyl, cyclohexylenemethyl, phenyl, $C_1$–$C_4$alkylphenyl, benzyl or $C_1$–$C_4$alkylphenylbenzyl.

$X_1$, $X_2$, $R_1$, $R_2$, $R_3$, r, s and Phot are subject independently to the embodiments and preferences indicated above.

$R_{23}$ and $R_{24}$ as alkyl are preferably $C_1$–$C_4$alkyl, for example methyl, ethyl, n- or i-propyl and n-, i- or t-butyl, as aryl are preferably naphthyl or phenyl and as aralkyl are preferably benzyl. With particular preference $R_{23}$ is H and $R_{24}$ is H or methyl.

$R_{25}$ is preferably H, —C(O)OH or —C(O)O—$C_1$–$C_4$alkyl.

$R_{26}$ as alkyl is preferably $C_1$–$C_4$alkyl, for example methyl, ethyl, n- or i-propyl and n-, i- or t-butyl, as aryl is preferably naphthyl or phenyl and as aralkyl is preferably benzyl. With particular preference $R_{26}$ is H.

$R_{27}$ as alkyl is preferably $C_1$–$C_4$alkyl, for example methyl, ethyl, n- or i-propyl and n-, i- or t-butyl, and as aryl is preferably phenyl and naphthyl. With particular preference $R_{27}$ is H, Cl, CN, phenyl or $C_1$–$C_4$alkyl.

$R_{28}$ as alkyl is preferably $C_1$–$C_4$alkyl, for example methyl, ethyl, n- or i-propyl and n-, i- or t-butyl. In the group —C(O)O—$R_{30}$, $R_{30}$ is preferably H or $C_1$–$C_{12}$alkyl, more preferably $C_1$–$C_6$alkyl, such as, for example, methyl, ethyl, propyl, butyl, pentyl, hexyl, heptyl, octyl, nonyl, decyl, undecyl, dodecyl, tetradecyl hexadecyl and octadecyl. With particular preference $R_{28}$ is H, —C(O)OH or —C(O)—O—$C_1$–$C_4$alkyl.

$R_{29}$ as alkyl is preferably $C_1$–$C_4$alkyl, for example methyl, ethyl, n- or i-propyl and n-, i- or t-butyl, as aryl is preferably phenyl and naphthyl and as aralkyl is preferably benzyl. $R_{29}$ is preferably H, $C_1$–$C_4$alkyl, phenyl, pyrrolidonyl, F, Cl, CN or the group $X_1$—$(R_1)_r$—$(X_2)_s$—H.

$R_{29}$ can for example be H, K, Na, $C_1$–$C_6$alkyl, $C_1$–$C_6$hydroxyalkyl, cyclohexylene, cyclopentyl, cyclohexylenemethyl, phenyl, methylphenyl, benzyl or methylphenylbenzyl. The structural units of the formula VII can be present in an amount of from 0.1 to 100 mol-%, preferably from 0.5 to 90 mol-%, more preferably from 0.5 to 80 mol-%, still more preferably from 1 to 80 mol-%, with particular preference from 1 to 60 mol-%, with especial preference from 1 to 50 mol-%, and with very particular preference 1 to 30 mol-%.

The structural units of the formula VIII can be present in an amount of from 99,9 to 0 mol-%, preferably from 99.5 to 0 mol-%, more preferably from 99.5 to 20 mol-%, still more preferably from 99 to 20 mol-%, with particular preference from 99 to 40 mol-%, with especial preference from 99 to 50 mol-%, and with very particular preference from 99 to 30 mol-%.

To increase the sensitivity, photoinitiators can be used together with sensitizers or coinitiators. In one preferred embodiment of the invention the sensitizers and coinitiators are bonded covalently to the polymer by way of functional groups. Known sensitizers and coinitiators are, for example, xanthones, anthraquinones, naphthacenequinones, thioxanthones, ethanolamines, aminobenzoic acids and Michler's ketone. Such functionalized sensitizers and coinitiators are known in large numbers and are therefore not specified further here. For the immobilization, the above-described bridging groups and functional groups come into consideration. Preferably, in the polymer of the invention, from 0.1 to 100 mol-%, preferably from 0.5 to 90 mol-%, more preferably from 0.5 to 80 mol-%, still more preferably from 1 to 80 mol-%, with particular preference from 1 to 60 mol-%, with especial preference from 1 to 50 mol-% and, with very particular preference, from 1 to 30 mol-% of the structural units of the formula VIII are replaced by structural units of the formula IX,

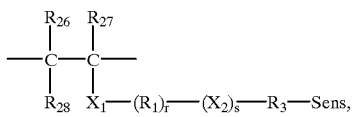

(IX)

in which $R_1$, $R_3$, $R_{26}$, $R_{27}$, $R_{28}$, $X_1$, $X_2$, r and s independently have the aforegoing definitions, including the preferred forms, and Sens is the monovalent radical of a coinitiator or sensitizer.

The figures in mol-% always add up to 100%.

In one preferred embodiment there are additionally bonded covalently to the polymer material free-radically or cationically photopolymerizable organic compounds which preferably correspond to the type of organic polymerizable compounds used in the polymerizable composition. In free-radically polymerizable ethylenically unsaturated systems, accordingly, use is made advantageously of ethylenically unsaturated compounds having functional groups, and in cationically polymerizable systems such as, for example, di- or polyepoxides use is made judiciously of di- or polyepoxides having functional groups.

Preference is given to structural units of ethylenically unsaturated organic compounds having covalently bonded olefin groups, which are known in large numbers. The radicals of ethylenically unsaturated organic compounds that are attached covalently to the polymer material can, for example, conform to structural units of the formula X

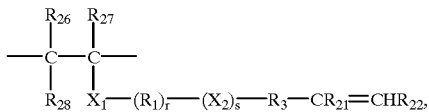

(X)

in which $X_1$ and $X_2$ independently of one another are a direct bond, or $X_2$ and $X_1$ together with the functional group independently of one another are —O—, —S—, —$NR_2$—, —C(O)—O—, —O—C(O)—, —O—C(O)—O—, —$SO_2$—O—, —O—$SO_2$—, —O—$SO_2$—O—, —$NR_2$—C(O)—, —C(O)—$NR_2$—, —$NR_2$—C(O)—O—, O—C(O)—$NR_2$—,
—$NR_2$—C(O)—$NR_2$—, —$NR_2$—$SO_2$—, —$SO_2$—$NR_2$—, —$NR_2$—$SO_2$—O—, O—$SO_2$—$NR_2$— or —$NR_2$—$SO_2$—$NR_2$—, $R_1$ is a bivalent bridging group, $R_2$ is H, $C_1$–$C_{12}$alkyl, $C_5$- or $C_6$cycloalkylene, $C_5$- or $C_6$cycloalkylenemethyl or -ethyl, phenyl, benzyl or 1-phenyleth-2-yl, $R_3$ is a direct bond, $C_1$–$C_{18}$alkylene, $C_5$- or $C_6$cycloalkyleneene, $C_6$–$C_{10}$arylene or $C_7$–$C_{12}$aralkylene, r is the number 0 or 1 and s is the number 0 or 1, and s is 0 if r is 0;

$R_{21}$ is H or $C_1$–$C_4$alkyl, especially methyl;

$R_{22}$ is H, $C_1$–$C_{12}$alkyl, phenyl or benzyl; and $R_{26}$, $R_{27}$ and $R_{28}$ are as defined for formula VIII.

$X_1$, $X_2$, $R_1$, $R_2$ and $R_3$ are subject to the preferences set out in the case of formula I. $R_{21}$ is preferably H or methyl, and $R_{22}$ is preferably H.

The structural units of the formula X can replace from 0.1 to 99.9999 mol-%, preferably from 0.5 to 90 mol-%, more preferably from 0.5 to 80 mol-%, still more preferably from 1 to 80 mol-%, with particular preference from 1 to 60 mol-%, with especial preference from 1 to 50 mol-% and, with very particular preference, from 1 to 30 mol-% of the structural units of the formula VIII.

The polymers of the invention can be crosslinked, furthermore, with at least difunctional monomers, for example from 0.01 to 30 mol-%, preferably from 0.1 to 15 mol-% of such monomers, based on the polymer. Depending on the nature of the polymer there can be used for this purpose at least trifunctional carboxylic acid, isocyanates, alcohols, amines or epoxides or, for addition polymers, organic compounds containing at least two ethylenically unsaturated groups. These crosslinking agents are known in large numbers. The ethylenically unsaturated crosslinking agents can, for example, be divinylbenzene, bis-dimethylmaleimide—alkylenes (for example bis(dimethylmaleinimidyl)methylene or -ethylene), acrylic or methacrylic esters or amides of polyols, preferably diols to tetrols, or, respectively, polyamines, preferably diamines to tetramines. Preference is given to aliphatic, cycloaliphatic and cycloaliphatic—aliphatic diols and diamines having with particular preference from 2 to 12 and with especial preference from 2 to 8 C atoms. Some examples of these diols are alkylene diols such as ethylene glycol, 1,2- or 1,3-propane diol, 1,2- , 1,3- , and 1,4-butanediol, pentanediol, hexanediol, octanediol, decanediol, dodecanediol, cyclohexanediol, di(hydroxymethyl)cyclohexane, polyoxaalkyleneglycols of preferably $C_2$–$C_6$ alkylenediols with preferably 2 to 100 alkylene diol units, with particular preference from 2 to 50 alkylene diol units, and with very particular preference from 2 to 20 alkylene diol units, such as, for example, polyethylene glycols, polypropylene glycols, polybutylene glycols and polyethylene/polypropylene glycols, and also 1,1,1-trihydroxymethylethane or -propane, pentaerythritol and dipentaerythritol. Some examples of polyamines are ethylenediamine, 1,2- and 1,3-propanediamine, 1,2- , 1,3- and 1,4- butanediamine, 1,6-hexanediamine, diethylenetriamine, triethylenetetramine, cyclohexanediamine, aminomethylcyclhexanamine, isophorondiamine and di(aminomethyl)cyclohexane.

In one preferred embodiment the polymers of the invention comprise at least one structural unit of the fQrmula XI,

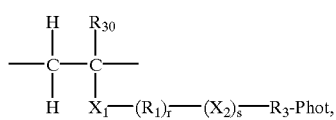

(XI)

in which $R_{30}$ is H or methyl and $X_1$, $X_2$, $R_1$, $R_3$, Phot, r and s are as defined above, including the preferences and particular embodiments.

The group —$X_1$—$(R_1)_r$—$(X_2)_s$—$R_3$— in the structural units of formula XI is preferably —C(O)—O—, —C(O)—O—$C_1$–$C_6$alkylene-O—, —C(O)—O—($C_2$–$C_6$alkylene-O)$_u$— where u is equal to a number from 2 to 10, C(O)—O—($C_2$–$C_6$alkylene-O)$_u$—$C_1$–$C_6$alkylene- where u is a number from 2 to 10 and —C(O)—O—$C_1$–$C_6$alkylene-S—.

The radical "Phot" can, for example, be radicals of the formulae

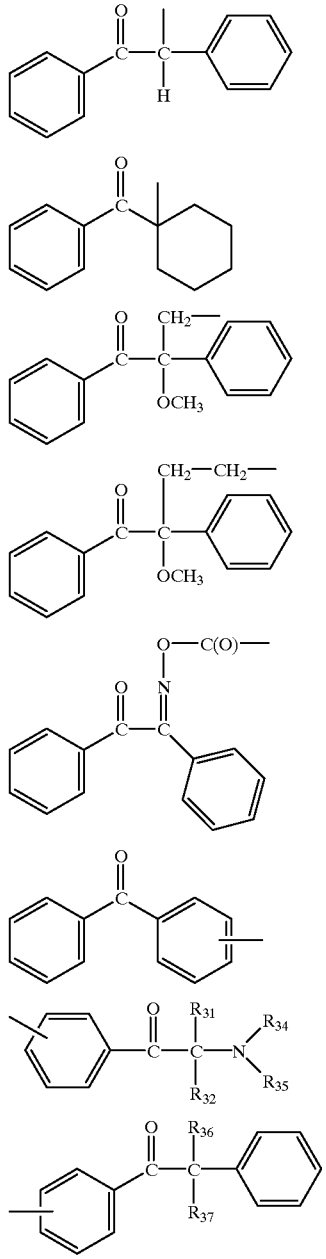

in which $R_{31}$ and $R_{32}$ independently of one another are $C_1$–$C_6$alkyl, $C_3$–$C_6$alkenyl, $C_5$- or $C_6$cycloalkylene, $C_7$–$C_{12}$aralkyl and especially allyl, benzyl or $R_{31}$ and $R_{32}$ together are tetra- or pentamethylene, $R_{34}$ and $R_{35}$ independently of one another are $C_1$–$C_{12}$- and preferably $C_1$–$C_6$alkyl, $C_5$- or $C_6$cycloalkylene, $C_7$–$C_{12}$aralkyl and preferably benzyl or 1-phenyleth-2-yl, or $R_{34}$ and $R_{35}$ together are tetramethylene, pentamethylene, —$CH_2CH_2$—O—$CH_2CH_2$— or —$CH_2CH_2$—N($C_1$–$C_4$alkyl)—$CH_2CH_2$, and $R_{36}$ and $R_{37}$, independently of one another are $C_1$–$C_6$alkoxy, $C_5$- or $C_6$cycloalkoxy, phenyloxy or phenyl-$C_1$–$C_4$alkoxy, or $R_{36}$ and $R_{37}$ together are $C_2$–$C_4$alkylenedioxyl or $C_2$–$C_4$alkenylenedioxyl.

The preferred addition polymers can in addition to the structural units of the formula XI also comprise identical or different structural units of the formula XII

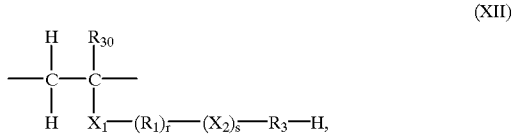
(XII)

in which $R_{30}$, $X_1$, $X_2$, $R_1$, $R_3$, r and s are as defined above. These structural units are present especially when the group "Phot" is prepared by reacting a polymer having functional groups and a photoinitiator having functional groups.

The preferred addition polymers can in addition to the structural units of the formula XI also comprise identical or different structural units of the formula XIII

(XIII)

$R_{30}$ is H or methyl, and $R_{38}$ is H, $C_1$–$C_4$alkyl, $C_1$–$C_4$alkoxy, -CN, Cl, phenyl, pyrrolidonyl, pyridinyl, imidazolyl, —C(O)OR$_{39}$ or —C(O)—NR$_{40}$R$_{41}$, $R_{39}$ is H or $C_1$–$C_{18}$- and preferably $C_1$–$C_{12}$alkyl, and $R_{40}$ and $R_{41}$ independently of one another are H or $C_1$–$C_{12}$- and preferably $C_1$–$C_6$alkyl.

In a further preferred embodiment, the addition polymers of the invention having structural units of the formula XI and, if desired, of the formulae XII and XIII are crosslinked with identical or different structural units of the formulae XIV or XV

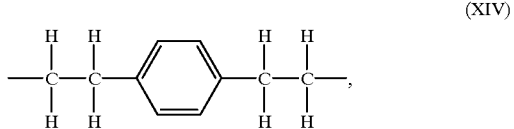
(XIV)

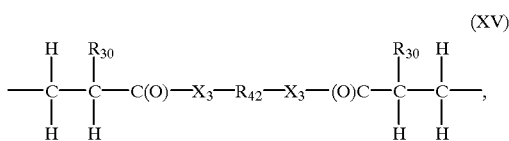
(XV)

in which $R_{30}$ is H or methyl, $X_3$ is —O— or —NH— or —N($C_1$–$C_4$alkyl)- , and $R_{42}$ is $C_2$–$C_{12}$- and preferably $C_1$–$C_6$alkylene, cyclohexyleneene, cyclohexyleneenedimethylene or $X_3$ is —O— and $R_{42}$ is $C_2$–$C_6$alkylene-($C_2$–$C_6$alkylene-O)$_2$ to 20-$C_2$–$C_6$alkylene-.

In a further preferred embodiment the addition polymers of the invention comprising structural units of the formula XI and, if desired, of the formulae XII, XIII, XIV and XV comprise identical or different structural units which comprise, attached in side chains, ionogenic groups such as, for example, —C(O)O$^-$ or —SO$_3^-$ or ammonium groups, or which comprise, attached in side chains, at least two ion-forming structural units, for example structural units with amine groups and structural units with —C(O)O$^-$ or —SO$_3^-$. These polymers are preferably emulsion polymers or a latex.

In a particularly preferred embodiment the addition polymers comprising the structural units of the formula XI and, if desired, structural units of the formulae XII, XIII, XIV and/or XV are those which in addition comprise identical or different ionogenic structural units of the formula XVI

(XVI)

in which $R_{30}$ is H or methyl, $R_{44}$ is H and $R_{43}$ is —C(O)OR$_{45}$, —SO$_3$R$_{45}$, —C$_6$H$_4$—COOR$_{45}$, —C$_6$H$_4$—SO$_3$R$_{45}$, —C$_6$H$_4$—R$_{46}$ or —C(O)—X$_4$–C$_2$–C$_6$alkylene-R$_{47}$, $R_{43}$ and $R_{44}$ independently of one another are —C(O)OR$_{45}$ or —C(O)—X$_4$–C$_2$–C$_6$alkylene-R$_{47}$, $R_{45}$ is an alkali metal, preferably Li, Na or K, $R_{46}$ is an ammonium group or an ammonium methyl group, and $R_{47}$ is an ammonium group.

The ammonium groups, or the ammonium in the ammonium methyl group, can be derived from primary, secondary or tertiary amine groups; the groups concerned are preferably quaternary ammonium groups. The ammonium groups or the ammonium in the ammonium methyl group can, for example, conform to the formula XVII

(XVII)

in which $R_{48}$, $R_{49}$ and $R_{50}$ independently of one another are H, unsubstituted or with —O(O) CCR$_{30}$=CH$_2$- substituted $C_1$–$C_{18}$- , preferably $C_1$–$C_{12}$- and more preferably $C_1$–$C_6$alkyl, $C_5$- or $C_6$cycloalkylene, phenyl, benzyl, 1-phenyl-eth-2-yl, or $R_{48}$ and $R_{49}$ together are tetramethylene, pentamethylene or —CH$_2$CH$_2$—O—CH$_2$CH$_2$- and $R_{50}$ is as defined above.

Suitable counterions are the anions of inorganic or organic acids, such as carboxylic acids, sulfonic acids and hydrohalic acids, for example. Chloride and bromide are preferred. With the quatemization, further ethylenically unsaturated groups can be covalently bonded at the same time. Quaternary ammonium groups are preferred.

The addition polymers of the invention comprising the structural units of the formula XI and, if desired, structural units of the formulae XII, XIII, XIV, and/or XV can in addition comprise structural units having acidic groups such as —C(O)OH or —SO$_3$H, for example, and additionally structural units having basic groups such as primary, secondary or tertiary amine groups, for example, especially when the addition polymers concerned are emulsion polymers In another particularly preferred embodiment the addition polymers comprising the structural units of the formula XI and, if desired, structural units of the formulae XII, XIII, XIV, and/or XV are those which in addition comprise identical or different structural units of the formulae XVIII and XIX

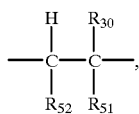
(XVIII)

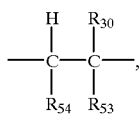
(XIX)

in which
$R_{30}$ is H or methyl,
$R_{52}$ is H and $R_{51}$ is —C(O)OH, —SO$_3$H, —C$_6$H$_4$—COOH, —C$_6$H$_4$—SO$_3$H,
$R_{51}$ and $R_{52}$ are —C(O)OH,
$R_{54}$ is H and $R_{53}$ is pyridinyl, imidazolyl, pyrrolidonyl, —C$_6$H$_4$—R$_{55}$ or —C(O)—X$_4$—C$_2$-C$_6$alkylene-R$_{56}$,
$X_4$ is —O—, —NH— or —N(C$_1$-C$_4$alkyl),
$R_{53}$ and $R_{54}$ independently of one another are —C(O)—X$_4$—C$_2$-C$_6$alkylene-R$_{56}$,
$R_{55}$ is an amine group or an aminomethyl group, and
$R_{56}$ is an amine group.

The amine group, and the amine group in the aminomethyl group, conform preferably to the formula XX

—NR$_{48}$R$_{49}$, (XX)

in which
$R_{48}$ and $R_{49}$ independently of one another are H, unsubstituted or with —O(O)CCR$_{30}$=CH$_2$-substituted C$_1$-C$_{18}$-, preferably C$_1$-C$_{12}$- and more preferably C$_1$-C$_6$alkyl, C$_5$- or C$_6$-cycloalkylene, phenyl, benzyl, 1-phenyl-eth-2-yl, or
$R_{48}$ and $R_{49}$ together are tetramethylene, pentamethylene or —CH$_2$CH$_2$—O—CH$_2$CH$_2$—.

Preference is given to secondary amine groups, especially di(C$_1$-C$_4$alkylamino), such as, for example, dimethylamino, diethylamino, di-n-propylamino and di-n-butylamino.

A preferred subgroup of addition polymers which may be present alongside the structural units of the formula XI and, if desired, structural units of the formulae XII, XIII, XIV and/or XV are those which can be modified subsequently to form quaternary ammonium groups. Examples of such groups are amine groups or haloalkyl groups, which can be reacted either with customary alkylating agents or, respectively, with secondary amines, it being possible to carry out this reaction homogeneously in solution or heterogeneously subsequent to the modification of surfaces of the microparticles These structural units conform preferably to the formula XXI

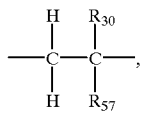
(XXI)

in which
$X_4$ is —O—, —NH— or —N(C$_1$-C$_4$alkyl)-,
$R_{30}$ is H or methyl, and
$R_{57}$ is —C$_6$H$_4$—CH$_2$Cl, —C$_6$H$_4$—CH$_2$Br, —C$_6$H$_4$—CH$_2$CH$_2$Cl, —C$_6$H$_4$—CH$_2$CH$_2$Br, —C(O)—X$_4$—C$_2$-C$_6$alkyleneCl, —C(O)—X$_4$—C$_2$-C$_6$alkylene-Br, pyridinyl, imidazolyl, pyrrolidonyl, —C$_6$H$_4$—R$_{55}$ or —C(O)—X$_4$—C$_2$-C$_6$alkylene-R$_{56}$,
$R_{55}$ is an amine group or an aminomethyl group, and
$R_{56}$ is an amine group.

For $X_4$ $R_{56}$ and $R_{56}$ the above-described preferences and embodiments apply.

The polymer of the invention comprising the structural units of the formula XI can as well as the additionally possible structural units also comprise structural units having covalently bonded sensitizers or coinitiators, as have been described above. Preference is given to structural units of the formula XXII

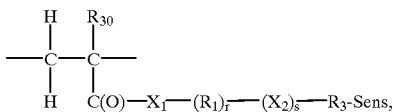
(XXII)

in which
$R_{30}$ is H or methyl,
$R_1$, $R_3$, $X_1$, $X_2$, r and s are as defined above, including the embodiments and preferences, and
Sens is a radical of the formula XIII

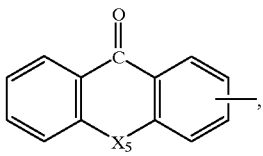
(XXIII)

in which
$X_5$ is —O— and preferably —S—.

Some examples of polymerizable radicals from which the radical of the formula XXI is derived are 1-, 2- or 3-carboxylthioxanthone or -xanthone, thioxanthone 2-ethylacrylate, thio- xanthone 2-methacrylate, thioxanthone 2-(oxaethyl)acrylate or- methacrylate, thioxanthone 2-(thioethyl)acrylate or- metacrylate, thioxanthone-2-acrylamide or -2-methacrylamide.

The polymers comprising the structural units of the formula X contain these structural units preferably in an amount of from 1 to 30, preferably from 2 to 15% by weight, based on the polymer. The structural units of the formula XII can be present in an amount from 99 to 0, preferably from 98 to 0% by weight. The structural units of the formula XIII can be present in an amount from 99 to 0, preferably from 98 to 0% by weight. The structural units of the formulae XIV and XV can be present in an amount from 0.1 to 30, preferably from 1 to 15% by weight. The structural units of the formula XVI can be present in an amount from 99 to 0, preferably from 98 to 10% by weight. The structural units of the formula XVIII and XIX can be present in an amount from 99 to 0, preferably from 98 to 10% by weight. The structural units of the formula XXI can be present in an amount from 99 to 0, preferably from 98 to 10% by weight. The structural units of the formula XXII can be present in an amount from 99 to 0, preferably from 98 to 10% by weight. The percentages by weight add up to 100% by weight.

In the case of the polymers of the invention comprising structural units of the formulae VII or XI, the polymers concerned are preferably emulsion polymers.

The preparation of the polymers to be used in accordance with the invention can be carried out by the techniques known in polymer chemistry. The monomers are known or can be prepared by known techniques. Known polymerization techniques are solution polymerization, mass (bulk) polymerization, emulsion polymerization and interfacial polymerization. It is advantageous to employ the technique of emulsion polymerization at high stirring speeds, since in this way the microparticles of the invention can be prepared directly and subsequent treatments such as, for example, milling can be avoided. The milling of polymers is also generally known. Ball mills are suitable, for example. To lessen the impact on the polymers, milling can be carried out with cooling. The preparation of the microparticles of the invention can also take place in solution, as above for the modification of surfaces in a heterogeneous reaction, by the reaction of natural or synthetic polymers with functional groups and functionalized photoinitiators and, if desired, further functionalized compounds such as cocatalysts, sensitizers or polymerizable compounds. Microparticles can then be obtained by precipitation from the solutions or by milling of the isolated, modified polymers. With this preparation it is likewise possible to employ the known methods of introducing spacers. In particular, it is also possible to carry out subsequent surface modification of polymers comprising the structural units of the formula VII and further structural units having functional groups, and to bond polymerizable groups and/or sensitizers or coinitiators, covalently, only to the surface of the microparticles.

The microparticles of the invention are outstanding photoinitiators for the free-radical or cationic polymerization, induced by actinic radiation, of monomers. They are of increased sensitivity, the polymerization time is shorter, and they form stable dispersions during the polymerization period. The physical and mechanical properties are improved relative to polymers prepared with conventional and soluble photoinitiators. The microparticles are stable on storage, with storage away from light possibly being advisable. The microparticles comprise free-flowing powders or latices. They can be formulated with ease, formulated systems also having a high storage stability in the absence of light. Latices can be used as such if the solubility of the monomers in the latex is tailored by the choice of solvents or monomers.

A further subject of the invention is a photopolymerizable and/or photocrosslinkable composition comprising (a) identical or different nonvolatile free-radically or cationically photopolymerizable or photocrosslinkable monomers and (b) a heterogeneous photoinitiator in microparticle form which consists of a finely divided substrate material to which identical or different photoinitiators are covalently bonded.

The amount of the heterogeneous photoinitiator is preferably at least 0.001% by weight, more preferably at least 0.01% by weight, based on the composition. The upper limit depends on the desired photosensitivity or on the obtention of additional effects. It is possible for up to 20% by weight, preferably up to 15% by weight, more preferably up to 10% by weight, with particular preference up to 5% by weight and, in particular, up to 3% by weight to be present if it is essentially the photoinitiator effect which is to be utilized. The heterogeneous photoinitiator can, however, be used simultaneously as a filler, in which case depending on the substrate material it is possible to influence the physical and/or mechanical properties of the polymers prepared. In the case of large amounts added, sufficient photosensitivity can be effected by adapting the refractive indices, so that translucent or transparent polymerizable compositions are present. For this purpose it is possible for up to 90% by weight, preferably from 10 to 80% by weight and, with particular preference, from 10 to 60% by weight to be present in the composition.

The heterogeneous photoinitiator in the composition is likewise subject to the above-described embodiments and preferred forms.

Photopolymerizable and photocrosslinkable monomers are known in large numbers and are described, for example, in Chemistry and Technology of UV & EB Formulations for Coatings, Inks and Paints, Vol. 2, Prepolymers and Reactive Diluents for UV and EB Curable Formulations, SITA Technology, London 1991. In the context of the invention the term monomers is understood to include oligomers and polymers, preferably low molecular mass polymers with structural units, which comprise covalently or ionogenically bonded, photopolymerizable groups in the polymer back bone or in side chains. Such oligomers and polymers have likewise been disclosed in large numbers.

Among the cationically polymerizable and/or crosslinkable monomers particular mention should be made of epoxide compounds having more than one epoxide group in the molecule, which are known in large numbers and are described in the literature.

Among the cationically and free-radically polymerizable monomers particular mention should be made of monomers having at least one ethylenically unsaturated group, which is known to the skilled worker in large numbers. They are preferably selected from the group of the substituted olefins, especially the acrylic and methacrylic esters and amides. Examples of substituents are $C_1-C_{18}$-, preferably $C_1-C_{12}$alkyl which is unsubstituted or substituted by —OH, —CN Cl, F, $C_1-C_{12}$- and preferably $C_1-C_6$alkoxy, —C(O)OH, —C(O)O—$C_1-C_{18}$alkyl, —C(O)O—$C_1-C_{18}$hydroxyalkyl, —C(O)Ocyclohexylene, —C(O)OCH$_2$cyclohexylene, —C(O)Ophenyl, —C(O)Obenzyl; $C_1-C_{12}$-, preferably $C_1-C_6$alkoxy which is unsubstituted or substituted by —OH, F, —Cl, $C_1-C_{12}$and preferably $C_1-C_6$alkoxy, $C_1-C_{12}$- and preferably $C_1-C_6$hydroxyalkoxy, —C(O)OH, —C(O)O—$C_1-C_{18}$alkyl, —C(O)O—$C_1-C_{18}$hydroxyalkyl, —C(O)Ocyclohexylene, —C(O)OCH$_2$cyclohexylene, —C(O)Ophenyl, —C(O)Obenzyl; Cl, —CN, pyridiyl, imidazolyl; phenyl which is unsubstituted or substituted by $C_1-C_4$alkyl, $C_1-C_4$alkoxy, —OH, —CN, halogen (such as, for example, F, Cl and Br), —C(O)OH, —C(O)—OC$_1$-C$_{18}$alkyl, —C(O)O—C$_2$-C$_{18}$hydroxyalkyl, —C(O)Ocyclohexylene, —C(O)—OCH$_2$cyclohexylene, —C(O)Ophenyl, —C(O)Obenzyl —SO$_3$H, —SO$_3$—C$_1$-C$_{18}$alkyl, chloromethyl, bromomethyl, —NH$_2$, primary or secondary amino having 1 to 20 C atoms, primary or secondary aminomethyl having 1 to 20 C atoms; —C(O)OH, —C(O)—O—C$_1$-C$_{20}$alkyl or -hydroxyalkyl, —C(O)Ocyclohexylene, —C(O)OCH$_2$cyclohexylene, —C(O)Ophenyl, —C(O)Obenzyl —C(O)—O—(C$_a$H$_{2a}$O)—H with a equal to a number from 2 to 6, preferably 2 to 4, and b equal to a number from 2 to 12, preferably 2 to 6; and —C(O)—NR$_{58}$R$_{59}$, in which R$_{58}$ and R$_{59}$ independently of one another represent H, $C_1-C_{12}$-, preferably $C_1-C_6$alkyl, $C_1-C_{12}$-, preferably $C_2-C_6$hydroxyalkyl, $C_1-C_6$alkyl- C(O)OH, $C_1-C_6$alkyl-C(O)O—$C_1-C_{12}$alkyl or (C$_a$H$_{2a}$O)—H with a equal to a number from 2 to 6, preferably 2 to 4, and b equal to a number from 2 to 12, preferably 2 to 6.

For crosslinking, at least diethylencially unsaturated organic compounds can be added to the monoethylenic organic compounds, for example in amounts of at least 0.1% by weight, based on the monomers. Such crosslinking agents have been mentioned before. Preference is given to di- or trifunctional, ethylenically unsaturated compounds. However, it is also possible to use only at least diethylenically unsaturated compounds as monomers.

In the art it is common to use mono- or polyfunctional acrylic or methacrylic esters or amides, alone or in a blend with at least two such esters or amides and/or in a blend with at least one other ethylenically at least monounsaturated monomer. The esters or amides are known or can be prepared by analogous techniques. They may conform to the formula XXIV

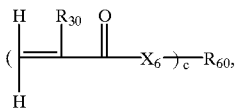

(XXIV)

in which
$R_{30}$ is H or methyl,
c is a number from 1 to 8,
X one of is the groups —O—, —NH— or —N($C_1$–$C_4$alkyl)- , and
$R_{60}$ is a monovalent to octavalent hydrocarbon radical having 1 to 50, preferably 1 to 30, and with particular preference 1 to 20 C atoms.

In formula XXIV c is preferably a number from 1 to 6, with particular preference from 1 to 4.

The hydrocarbon radical can comprise one or more identical or different groups selected from ether, thioether, amine, ester, carbonate, amide, urea and urethane groups, especially if spacer groups are introduced with chain extenders. The hydrocarbon radical can be selected from identical or different radicals from the group of the aliphatic, cycloaliphatic, heterocycloaliphatic cycloaliphatic-aliphatic, heterocycloaliphatic-aliphatic, aromatic, heteroaromatic, aromatic-aliphatic and heteroaromatic-aliphatic radicals.

With preference, $R_{60}$ is derived from alcohols or amines or, respectively, from polyols or polyamines, where, in the case of the polyols and polyamines, it is possible for free OH groups or, respectively, amine groups to be present. The monomers of the formula XXIV are known in many cases or can be prepared by analogous techniques.

The composition of the invention may comprise an inert solvent. Inert means that the choice of the solvents is guided by the reactivity of the constituents present in the composition, and the solvents are selected so that no unwanted reactions are able to occur.

Examples of suitable inert solvents are protic- polar and aprotic solvents, which can be used alone or in mixtures of at least two solvents. Examples are: water, alkanols (methanol, ethanol, propanol, butanol, ethylene glycol monomethyl or monoethyl ether, ethers (dibutyl ether, tetrahydrofuran, dioxane, ethylene glycol monomethyl or dimethyl ether, ethylene glycol monoethyl or diethyl ether, diethylene glycol diethyl ether, triethylene glycol dimethyl ether), halogenated hydrocarbons (methylene chloride, chloroform, 1,2-dichloroethane, 1,1,1-trichloroethane, 1,1, 2,2-tetrachloroethane), carboxylic esters and lactones (ethyl acetate, methyl propionate, ethyl benzoate, 2-methoxyethyl acetate, γ- butyrolactone, δ-valerolactone, pivalolactone), carboxamides and lactams (N,N-dimethylformamide, N,N-diethylformamide, N,N-dimethylacetamide, tetramethylurea, hexamethylphosphoramide, γ-butyrolactam, ε-caprolactam, N-methylpyrrolidone, N-acetylpyrrolidone, N-methyl-caprolactam), sulfoxides (dimethyl sulfoxide), sulfones (dimethyl sulfone, diethyl sulfone, trimethylene sulfone, tetramethylene sulfone), tertiary amines (N-methylpiperidine, N-methylmorpholine), aliphatic and aromatic hydrocarbons such as, for example, petroleum ether, pentane, hexane, cyclohexane, methylcyclohexane, benzene or substituted benzenes (chlorobenzene, o-dichlorobenzene, 1,2,4-trichlorobenzene, nitrobenzene, toluene, xylene) and nitriles (acetonitrile, propionitrile, benzonitrile, phenylacetonitrile).

Preferred solvents from an ecological standpoint are water, alkanols and mixtures of water and water-miscible solvents, using polymerizable monomers which are soluble in these solvents.

The compositions of the invention are storage-stable in the absence of light and insensitive to air and moisture, thus permitting storage and reaction without inert gas and even with water as solvent. Prior to the photochemical polymerization the composition can be stored as a ready-to-use formulation, which is advantageous for large-scale industrial use. Alternatively, however, the mixing of the components can take place directly prior to processing.

The composition of the invention can comprise formulating auxiliaries. Suitable such auxiliaries are the compounds indicated above as solvents. Known auxiliaries are antioxidants, light stabilizers, plasticizers, dyes, pigments, fillers, including reinforcing fillers, lubricants, surfactants and m old release auxiliaries.

The composition of the inven tion can be prepared by simple mixing of the components, in which context the photoinitiators of the invention can be incorporated with particular ease, and dispersions are obtained with a uniform distribution of the heterogeneous photoinitiators. The dispersion s are generally stable, which depends in the main on the viscosity of the composition. Insofar as the microparticles settle or become concentrated, they can be evenly redispersed in a simple manner by stirring them again.

From the composition of the invention it is possible, through the action of actinic radiation, to produce shaped articles of all kinds, coatings and relief images or relief structures. The actinic radiation can range from γ radiation up to the near IR range. The radiation employed is guided essentially by the absorption of the photoinitiators used. Preference is given to the use of light from the UV region to the visible region. Suitable radiation sources are known. They can, for example, comprise lamps or lasers. Preference is given to the use of UV lamps (mercury vapor lamps) or UV lasers. The period of irradiation depends on the nature of the light source; it can range from seconds to minutes.

If the composition of the invention additionally comprises monomers which are heat-curable after the photoreaction as well, then heat curing may follow. In addition, a thermal aftertreatment following the photoreaction can be advantageous.

The process of the invention is preferably carried out at room temperature to slightly elevated temperature. An increase in temperature serves to increase the reaction rate. The process of the invention is conducted in particular at temperatures from room temperature up to +110° C.

A further subject of the invention is a process for polymerizing or crosslinking a photopolymerizable and/or photocrosslinkable composition comprising (a) identical or different nonvolatile free-radically or cationically photopolymerizable or photocrosslinkable monomers and (b) a photoinitiator, which is characterized in that the photoinitiator is present as a heterogeneous photoinitiator in microparticle form which consists of a finely divided substrate material to which identical or different photoinitiators, or photoinitiators and sensitizers or coinitiators, are covalently bonded.

Another subject of the invention are the polymers obtainable with the process of the invention, formed from identical or different nonvolatile free- radically or cationically photopolymerizable or photocrosslinkable monomers, which polymers are characterized in that they comprise microparticles to which identical or different cleavage products of photoinitiators, or photoinitiators and sensitizers or coinitiators, are covalently bonded.

The cleavage products are the breakdown products of the photoinitiator which are formed by actinic radiation. The presence of unconsumed, covalently bonded photoinitiators depends essentially on their concentration in the polymerizable composition.

Depending on the monomer used the polymers of the invention can have very different properties. Some feature very high oxygen permeability, low dielectric constants, good thermal stability and low water absorption. Others have outstanding optical properties such as, for example, high transparency and low refractive indices, or good mechanical properties. Furthermore, emphasis should be given to low shrinkage and the excellent surface smoothness. As a consequence, they can be used in a very wide variety of technical fields.

These polymers are suitable for the production of medical devices, implants or contact lenses; for producing electronic components; as binders for coating materials; as photocurable compositions for modeling or as adhesives for the bonding of substrates, and as a photopolymerizable composition in stereolithography. The compositions of the invention can also be used to produce coating materials by means of photopolymerization, in which case on the one hand clear (transparent) and even pigmented compositions can be used. Both white pigments and color pigments can be used.

As coatings on the surface of substrate materials, the compositions of the invention feature high bond strength. In addition, the coated materials feature very high surface smoothness and surface luster. They are outstandingly suitable as resist materials.

The photocurable compositions of the invention are particularly suitable for the production of protective coats and relief images. A further subject of the invention is a variant of the process of the invention for preparing coated materials and relief images on substrates, in which a composition of the invention with or without solvent is applied as a coat to a substrate, for example by dipping, brushing, pouring, rolling, knife coating or spin coating, the solvent (if used) is removed, and the coat is polymerized by irradiation, or the coat is irradiated through a photomask and then the non-irradiated areas are removed with a solvent. With this process it is possible to protect or modify substrate surfaces, or to produce, for example, printed circuits, printing plates or printing rollers. In the case of the production of printed circuits, the compositions of the invention can also be employed as solder resists. Further possible applications are the production of screen printing masks, and the use as radiation-curable printing inks for offset, screen and flexographic printing. In the course of irradiation, the photopolymerizable coat can be masked off with a radiation-permeable protective film.

A further subject of the present invention is a coated substrate material which is characterized in that a coat of a composition of the invention is applied to a substrate.

Likewise a subject of the present invention is a coated substrate with a continuous or interrupted coat of a polymer formed from identical or different nonvolatile free-radically or cationically photopolymerizable or photocrosslinkable polymers, which is characterized in that the polymer comprises microparticles to which identical or different cleavage products of photoinitiators, or photoinitiators and sensitizers or coinitiators, are covalently bonded.

Suitable substrates (substrate materials) are, for example, those of glass, minerals, ceramics, plastics, wood, semimetals, metals, metal oxides and metal nitrides. The coat thicknesses depend essentially on the desired use and can be for example from 0.1 to 1000 $\mu$m, preferably from 0.5 to 500 $\mu$m and, with particular preference, from 1 to 100 $\mu$m. The coated materials are notable for high bond strength and good thermal and mechanical properties.

The preparation of the coated materials of the invention can take place by known methods such as, for example, brushing, knife coating and flow coating techniques such as curtain coating or spin coating.

A further subject is the use of heterogeneous photoinitiators in microparticle form which consist of a finely divided substrate material to which identical or different photoinitiators are covalently bonded for the radiation-induced polymerization of photopolymerizable or photocrosslinkable monomers.

The heterogeneous photoinitiators of the invention are particularly notable, surprisingly, for a relatively high sensitivity and relatively short reaction times, with, in addition, the conversion of the monomers after the start of polymerization taking place within a substantially shorter period of time compared with the same amount of photoninitiator in the homogeneous reaction mixture (photoinitiator dissolved).

The examples which follow illustrate the invention.

A) Preparation of heterogeneous photoinitiators

EXAMPLE A1

Preparing a microgel based on styrene

The following components are used:

96 g (0.92 mol) of styrene 96 g (0.628 mol) of vinylbenzyl chloride 8 g (0.062 mol) of divinylbenzene 16 g (0.058 mol) of $\alpha$-hydroxyacetophenone p-ethoxyacrylic ester 2.8 g of $K_2S_2O_8$ 0.96 g of $NaHSO_3$ 10.8 g of sodium lauryl sulfate 672 ml of deionized water Sodium lauryl sulfate and 600 ml of deionized water are charged to a flask. This initial charge is stirred at 200 revolutions per minute, flushed with nitrogen and heated to 60C. 20 ml of an aqueous solution of the monomers are added. After 10 minutes, 1.4 g of $K_2S_2O_8$ dissolved in 30 ml of water and 0.48 g of $NaHSO_3$ solution in 6 ml of water are added. The remainder of the monomers is added slowly thereafter over the course of one hour. Subsequently, the remaining 1.4 g of $K_2S_2O_8$ and 0.48 g of $NaHSO_3$ are added and the mixture is stirred for 3 hours, to give 876.2 g (97% of theory) of an aqueous emulsion (latex).

For characterization, 100 g of the emulsion are coagulated with 5 g of $MgSO_4$. The isolated polymer is washed with deionized water and then dried in vacuo. This gives 24 g of polymer, corresponding to a content of the latex of 24% (theory 24.3%). The chlorine content is determined as 9.91% (theory: 10.01%). The size of the polymer particles in the aqueous emulsion is determined by means of quasi-elastic light scattering and is 35–50 nm. Determination of the particle size by electronmicroscopy gives, in good correspondence, 50 nm.

EXAMPLE A2

Quaternizing

The latex obtained according to Example A1 is subsequently quaternized with dimethylbenzylamine. The following are used:

500 g of latex according to Example A1
47.05 g of N,N-dimethylbenzylamine
620.3 g of deionized water
501.15 g of isopropanol The stated amount of latex is charged to a flask at 200 rpm and at room temperature a 1:3 mixture of water and isopropanol added except for a remaining amount of 50 ml thereof. N,N-Dimethylbenzylamine is dissolved in the 50 ml of solvent and this solution is added dropwise over 1.5 hours. Then the mixture is stirred at room temperature for 16 hours. This gives a homogeneous dispersion having a pH of 7.

The product obtained is coagulated with saturated NaCl solution and the coagulated product is filtered off, washed with deionized water and dried. Yield: 159.3 g (95% of theory). Analysis: Cl to N: 2.41 (theory 2.54).

EXAMPLE A3

Introducing unsaturated groups by quaternization

The following constituents are used:

200 g of latex according to Example A1 (24.3% solids content)
22.01 g of 2-dimethylaminoethyl methacrylate (DMAM)
273.5 g of deionized water
212.4 g of isopropanol.

A 1:3 mixture of water/isopropanol is charged, except for a remaining amount of 50 ml, with the latex to a flask and is stirred at 200 rpm, and then DMMA in 50 ml of water/isopropanol (1:3) is added dropwise at room temperature over 1.5 hours. Then stirring is continued at 60 C for 16 hours. The resulting homogeneous emulsion has a pH of 7.

The emulsion is coagulated with 50 ml of saturated NaCl solution with stirring at 300 rpm for 10 minutes, and the polymer is filtered off, washed with deionized water and dried at 50 C in vacuo. Yield: 64.13 g (91% of theory). Elemental analysis ratio Cl to N: 2.65 (theory: 2.54).

EXAMPLE A4

The following components are used:
10.5 g of ethyl acrylate (0.105 mol)
1 g of butanediol dimethacrylate (0.0044 mol)
14.5 g of methacrylic acid
24 g of α-hydroxyacetophenone p-ethoxyacrylic ester (0.0862 mol)
0.8 g of sodium dodecyl sulfate and 200 ml of deionized water are charged to the reaction flasks. This initial charge is stirred (about 250 rpm), flushed with nitrogen and heated to 80 C. The α-hydroxyacetophenone p-ethoxyacrylic ester is added and the mixture is flushed with nitrogen for 20 minutes. Then the ethyl acrylate, butanediol dimethacrylate and the methacrylic acid are added, and 0.5 ml of a 7% strength aqueous $Na_3PO_4$ solution is added. The supply of nitrogen is stopped and the emulsion is homogenized for 10 minutes. Then 2 ml of an aqueous 5% strength potassium persulfate solution are added. The batch is polymerized for 1 hour and then a further 2 ml of the aqueous 5% strength potassium persulfate solution are added. The batch is heated at 80 C for 3 hours more. It is then filtered over glass wool to give 248.5 g of polymer latex. The dried polymer has a glass transition temperature of 173 C. The emulsion has a content of 19.3 per cent.

EXAMPLE A5

Quaternizing the latex according to Example A4

The following constituents are used:

150 g of latex according to Example A4
15.34 g of N,N-dimethylaminoethyl methacrylate (DMAM)
132.9 g of isopropanol
144.8 g of deionized water The latex is charged to a flask and is stirred at 200 rpm. The mixture of water and isopropanol, except for 30 ml, is added. The DMAM is dissolved in this 30 ml, the solution is added dropwise (over one hour) and then the batch is stirred at 60 C for 6 hours. It is filtered over glass wool to give 418 g.

B) Use Examples

EXAMPLE B1

Producing relief images 100 parts by weight each of polymer particles according to Examples A1, A2 and A3 are mixed uniformly, while stirring, with 100 parts by weight of bispentaerythritol monohydroxy-pentaacrylate (Sartomer® 399). The mixtures are applied by knife coating to copper laminate plates as films 8 to 10 μm thick and are covered with an 8 to 10 μm thick film of polyvinyl alcohol. The plates are exposed from a distance of 20 cm through a mask (Stouffer wedge) with a UV lamp. After development, a firmly adhering relief image with very good resolution is obtained.

EXAMPLE B2

Determining the reaction enthalpies

The following formulations are used:

| Formulation A | Formulation B |
| --- | --- |
| 54.4 g of hydroxyethyl methacrylate | 50 g of hydroxyethyl methacrylate |
| 50.0 g of butanediol diacrylate | 50 g of butanediol diacrylate |
| 8.09 g α-hydroxyacetophenone (Irgacure® 2959) | 22 g of latex from Example A5 |
| 307.51 ml of water/isopropanol (2:1) | 288 of water/isopropanol (2:1) |

Both formulations (4.3 g, 30 per cent strength in water/isopropanol)) contain the same amount of double bonds ($2.19 \times 10^{-3}$ mol/g) and photoinitiator. By means of differential scanning calorimetry the course of the polymerization by irradiation with an He/Cd laser at 325 nm is determined by the isothermal measurement of the heat given off as a function of time. When making the comparison it should be borne in mind that only photoinitiators bonded at the surface of the microparticles can be effective. Result:

|  | Reaction peak after minutes | Reaction peak after 6 minutes |
|---|---|---|
| Formulation A | 5.73 | 41.9% |
| Formulation B | 3.67 | 88.9% |

We claim:

1. Heterogenous photoinitiator in microparticle form which consists of a finely divided substrate material to which identical or different photoinitiators are covalently bonded via functional groups of the substrate material wherein the substrate material is a plastic consisting essentially of a polymer with functional groups or a subsequently surface-modified polymer for introducing functional groups for the covalent bonding of the photoinitiators and the microparticles have a mean particle size of from 2 to 500 nm.

2. Photoinitiator according to claim 1, characterized in that the microparticles have a mean particle size of from 5 to 300 nm.

3. Photoinitiator according to claim 1, characterized in that the microparticles have a mean particle size of from 5 to 200 nm.

4. Photoinitiator according to claim 1, characterized in that the microparticles have a mean particle size of from 5 to 300 nm.

5. Photoinitiator according to claim 1 characterized in that the functional groups of the substrate material are amine, hydroxyl, carboxyl, —$SO_3H$ or isocyanate.

6. Photoinitiator according to claim 1 characterized in that the substrate material comprises subsequently modified or milled natural or synthetic polymers.

7. Photoinitiator according to claim 1, characterized in that the photoinitiator is bonded covalently to the substrate material by way of a bridging group.

8. Photoinitiator according to claim 7, characterized in that the bridging group contains 1 to 30 atoms selected from the group C, O, S and N.

9. Photoinitiator according to claim 7, characterized in that the bridging group comprises a hydrocarbon radical or a hydrocarbon radical interrupted by one or more heteroatoms selected from the group O, S and N.

10. Photoinitiator according to claim 1, characterized in that the heterogeneous photoinitiator consists of microparticles to whose functional groups on the surface a photoinitiator is covalently bonded, directly or by way of a bridging group.

11. Photoinitiator according to claim 10, characterized in that the photoinitiator radical attached to the functional groups on the surface conforms to the formula I,

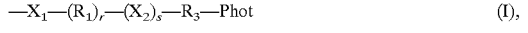

in which $X_1$ and $X_2$ independently of one another are a direct bond, or $X_2$ and $X_1$ independently of one another are —O—, —S—, —$NR_2$—, —C(O)—O—, —O—, C(O)—, —O—C(O)—O—, —$SO_2O$—, —O—$SO_2$—, —O—$SO_2$—O—, —$NR_2$—C(O)—, —C(O)—$NR_2$—, —$NR_2$—C(O)—O—, O—C(O)—$NR_2$—, $NR_2$—C(O)—$NR_2$—, —$NR_2$—$SO_2$—, —$SO_2$—$NR_2$—, —$NR_2$—$SO_2$—O—, O—$SO_2$—$NR_2$— or —$NR_2$—$SO_2$—$NR_2$—, $R_1$ is a bivalent bridging group, Phot is a monovalent radical of a photoinitiator, $R_2$ is H, $C_1$–$C_{12}$alkyl, $C_5$- or $C_6$cycloalkylene, $C_5$- or $C_6$cycloalkylenemethyl or -ethyl, phenyl, benzyl or 1-phenyleth-2-yl, $R_3$ is a direct bond, $C_1$–$C_{18}$alkylene, $C_5$- or $C_6$cycloalkyleneene, $C_6$–$C_{10}$arylene or $C_7$–$C_{12}$aralkylene, r is the number 0 or 1 and s is the number 0 or 1, and s is 0 if r is 0.

12. Photoinitiator according to claim 11, characterized in that the bivalent bridging group is a hydrocarbon radical which contains 1 to 30 C atoms and which is unsubstituted or substituted one or more times by $C_1$–$C_4$alkyl, $C_1$–$C_4$alkoxy or =O.

13. Photoinitiator according to claim 12, characterized in that the hydrocarbon radical is interrupted one or more times with heteroatoms selected from the group —O—, —S— and —$NR_2$—, where $R_2$ is H or $C_1$–$C_4$alkyl.

14. Photoinitiator according to claim 11, characterized in that the photoinitiators from which the radical of the formula I is derived are benzoin, hydroxybenzoin, and hydroxyalkylated benzoin derivatives.

15. Photoinitiator according to claim 14, characterized in that the photoinitiators from which the radical of the formula I is derived conform to the formula II,

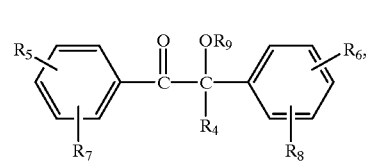

in which $R_4$ is H, $C_1$–$C_8$alkyl, $C_1$–$C_6$hydroxyalkyl, cyclohexylene, phenyl or benzyl, $R_9$ is H, $C_1$–$C_8$alkyl, $C_2$–$C_6$hydrox Alkyl or $C_1$–$C_6$carboxylalkyl, and $R_5$, $R_6$, $R_7$ and $R_8$ independently of one another are H, $C_1$–$C_4$-alkyl, $C_1$–$C_4$alkoxy, F or Cl; or $R_4$ is $C_1$–$C_6$hydroxyalkyl or $C_1$–$C_6$carboxylalkyl, $R_9$ is $C_1$–$C_8$alkyl, cyclohexylene, phenyl or benzyl, and $R_5$, $R_6$, $R_7$ and $R_8$ independently of one another are H, $C_1$–$C_4$alkyl, $C_1$–$C_4$alkoxy, F or Cl; or one of $R_5$, $R_6$, $R_7$ and $R_8$ is hydroxyl and the others are H, $C_1$–$C_4$alkyl, $C_1$–$C_4$alkoxy, F or Cl, $R_4$ is H, $C_1$–$C_4$alkoxy, benzyloxy or phenyloxy, and $R_9$ is H, $C_1$–$C_6$alkyl, $C_2$–$C_6$hydroxyalkyl, cyclohexylene, phenyl or benzyl.

16. Photoinitiator according to claim 11, characterized in that the photoinitiators from which the radical of the formula I is derived are α-hydroxyalkylphenones.

17. Photoinitiator according to claim 16, characterized in that the photoinitiators from which the radical of the formula I is derived conform to the formula III,

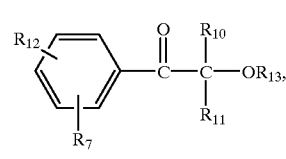

in which

R$_7$ is H, C$_1$–C$_4$alkyl, C$_1$–C$_4$alkoxy, F, or Cl;

R$_{10}$ and R$_{11}$ independently of one another are C$_1$–C$_{12}$ alkyl, C$_5$- or C$_6$cycloalkylene, phenyl or phenyl-C$_1$–C$_4$alkyl, or R$_{10}$ and R$_{11}$ together are —C$_n$H$_{2n}$— and n is a number from 3 to 7;

R$_{12}$ is H, —OH, —SH, C$_2$–C$_6$hydroxyalkyloxy or C$_2$–C$_6$hydroxyalkylthio; and R$_{13}$ is H, C$_1$–C$_6$alkyl, C$_5$- or C$_6$cycloalkylene, phenyl or benzyl, with the proviso that R$_{12}$ is not H if R$_{13}$ is H, C$_1$–C$_6$alkyl, C$_5$- or C$_6$cycloalkylene, phenyl or benzyl.

18. Photoinitiator according to claim 11, characterized in that the photoinitiators from which the radical of the formula I is derived are hydroxyl-containing benzil ketals.

19. Photoinitiator according to claim 18, characterized in that the photoinitiators from which the radical of the formula I is derived conform to the formula IV,

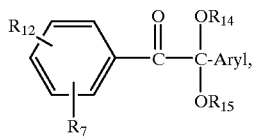

(IV)

in which

R$_7$ is H, C$_1$–C$_4$alkyl, C$_1$–C$_4$alkoxy, F or Cl;

R$_{12}$ is —OH, —SH, C$_2$–C$_6$hydroxyalkyloxy or C$_2$–C$_6$hydroxyalkylthio;

R$_{14}$ and R$_{15}$ independently of one another are C$_1$–C$_6$alkyl, C$_5$- or C$_6$cycloalkylene, phenyl or phenyl- C$_1$–C$_4$alkyl;

R$_{14}$ and R$_{15}$ together are C$_2$–C$_4$alkylene or C$_2$–C$_4$alkenylene, and Aryl is unsubusituted or C$_1$–C$_4$alkyl, C$_1$–C$_4$alkoxy, F- or Cl-substituted naphthyl and especially phenyl.

20. Photoinitiator according to claim 18, characterized in that the photoinitiators from which the radical of the formula I is derived conform to formula V,

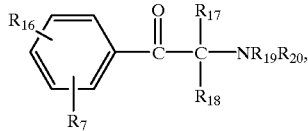

(V)

in which

R$_7$ is H, C$_1$–C$_4$alkyl, C$_1$–C$_4$alkoxy, F or Cl;

R$_{16}$ is —OH, —SH, —NHR$_2$, C$_2$–C$_6$hydroxyalkyloxy or C$_2$–C$_6$hydroxyalkylthio or C$_2$–C$_6$hydroxyalkyl-NR$_2$- and R$_2$ is H, C$_1$–C$_{12}$alkyl, C$_5$- or C$_6$cycloalkylene, C$_5$- or C$_6$cycloalkylenemethyl or -ethyl, phenyl, benzyl or 1-phenyleth-2-yl;

R$_{17}$ and R$_{18}$ independently of one another are C$_1$–C$_{12}$alkyl, C$_5$- or C$_6$cycloalkylene, C$_5$- or C$_6$cycloalkylenemethyl or -ethyl, phenyl, phenylmethyl or 1-penyleth-2-yl, where the phenyl groups are unsubstituted or substituted by C$_1$–C$_4$alkyl or C$_1$–C$_4$alkoxy; and R$_{19}$ and R$_{20}$ independently of one another are C$_1$–C$_{12}$alkyl, C$_2$–C$_6$alkenyl, C$_2$–C$_6$hydroxyalkyl, C$_5$- or C$_6$cycloalkylene, C$_5$- or C$_6$cycloalkylenemethyl or -ethyl, phenyl, phenylmethyl or 1-penyleth-2-yl, where the phenyl groups are unsubstituted or substituted by C$_1$–C$_4$alkyl or C$_1$–C$_4$alkoxy, or R$_{19}$ and R$_{20}$ together are —(CH$_2$)$_4$- , —(CH$_2$)$_5$- , —CH$_2$CH$_2$—O—CH$_2$CH$_2$- or —CH$_2$CH$_2$—NR$_2$—CH$_2$CH$_2$—; and R$_2$ is H, C$_1$–C$_{12}$alkyl, C$_2$–C$_6$hydroxyalkyl, C$_5$- or C$_6$cycloalkylene, C$_5$- or C$_6$cycloalkylenemethyl or -ethyl, phenyl, benzyl or 1-phenyleth-2-yl.

21. Photoinitiator according to claim 11, characterized in that the photoinitiators from which the radical of the formula I is derived are α-aminoalkylphenones which contain hydroxyl groups, thiol groups or —NHR$_2$ groups.

22. Photoinitiator according to claim 1, characterized in that the amount of the photoinitiators bonded covalently to the substrate material is from 0.0001 to 100% by weight, based on the substrate material.

23. Photoinitiator according to claim 22, characterized in that the amount of the photoinitiators bonded covalently to the substrate material is from 0.1 to 100% by weight, based on the substrate material.

24. Photoinitiator according to claim 22, characterized in that the amount of the photoinitiators bonded covalently to the substrate material is from 1 to 90% by weight, based on the substrate material.

25. Photoinitiator according to claim 22, characterized in that the amount of the photoinitiators bonded covalently to the substrate material is from 2 to 80% by weight, based on the substrate material.

26. Photoinitiator according to claim 22, characterized in that the amount of the photoinitiators bonded covalently to the substrate material is from 20 to 80% by weight, based on the substrate material.

27. Photoinitiator according to claim 1, characterized in that additionally sensitizers, coinitiators or both are bonded covalently to the substrate material by way of functional groups.

28. Photoinitiator according to claim 27, characterized in that the amount of the sensitizers and coinitiators bonded covalently to the substrate material is from 0.0001 to 99.9999% by weight, based on the substrate material.

29. Photoinitiator according to claim 1, characterized in that there are additionally bonded ionogenically or covalently to the substrate material free-radically or cationically photopolymerizable organic compounds which correspond to the organic compounds used in the polymerizable composition.

30. Photoinitiator according to claim 29, characterized in that the radicals bonded covalently to the substrate material are ethylenically unsaturated organic compounds of the formula VI,

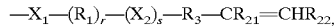

(VI)

in which

X$_1$ and X$_2$ independently of one another are a direct bond, or X$_2$ and X$_1$ together with the functional group independently of one another are —O—, —S—, —NR$_2$—, —C(O)—O—, —O—C(O)—, —O—C(O)—O—, —SO$_2$—O—, —O—SO$_2$—, —O—SO$_2$—O—, —NR$_2$—C(O)—, —C(O)—NR$_2$—, —NR$_2$—C(O)—O—, O—C(O)—NR$_2$—, —NR$_2$—C(O)—NR$_2$—, —NR$_2$—SO$_2$—, —SO$_2$—NR$_2$—, —NR$_2$—SO$_2$—O—, O—SO$_2$—NR$_2$— or —NR$_2$—SO$_2$—NR$_2$—, R$_1$ is a bivalent bridging group, R$_2$ is H, C$_1$–C$_{12}$alkyl, C$_5$- or C$_6$cycloalkylene, C$_5$- or C$_6$cycloalkylenemethyl or -ethyl, phenyl, benzyl or 1-phenyleth-2-yl, $R_3$ is a direct bond, $C_1$–$C_{18}$alkylene, $C_5$- or $C_6$cycloalkyleneene, $C_6$–$C_{10}$arylene or $C_7$–$C_{12}$aralkylene, r is the number 0 or 1 and s is the number 0 or 1, and s is 0 if r is 0;

$R_{21}$ is H or $C_1$–$C_4$alkyl; and $R_{22}$ is H, $C_1$–$C_{12}$alkyl, phenyl or benzyl.

31. Photoinitiator according to claim 29, characterized in that the amount of the ionogenically or covalently bonded, free-radically or cationically photopolymerizable organic compounds is from 0.0001 to 99.9999% by weight, based on the substrate material.

32. Photoinitiator according to claim 1, characterized in that the polymers concerned are polymers to whose backbone monovalent radicals of identical or different photoinitiators are covalently bonded, directly or by way of a bridging group.

33. Photoinitiator according to claim 32, characterized in that the polymers concerned are addition polymers with from 100 to 0.1 mol-% of identical or different structural units of the formula VII,

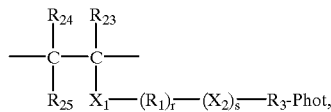

(VII)

and from 0 to 99.9 mol-% of identical or different structural units of the formula VIII

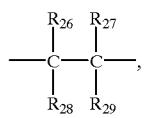

(VIII)

in which $X_1$ and $X_2$ independently of one another are a direct bond, or $X_2$ and $X_1$ together with the functional group independently of one another are —O—, —S—, —$NR_2$—, —C(O)—O—, —O—C(O)—, —O—C(O)—O—, —$SO_2$—O—, —O—$SO_2$—, —O—$SO_2$—O—, —$NR_2$—C(O)—, —C(O)—$NR_2$—, —$NR_2$—C(O)—O—, O—C(O)—$NR_2$—, —$NR_2$—C(O)—$NR_2$—, —$NR_2$—$SO_2$—, —$SO_2$—$NR_2$—, —$NR_2$—$SO_2$—O—, O—$SO_2$—$NR_2$— —$NR_2$—$SO_2$—$NR_2$—, $R_1$ is a bivalent bridging group, Phot is a monovalent radical of a photoinitiator, $R_2$ is H, $C_1$–$C_{12}$alkyl, $C_5$- or $C_6$cycloalkylene, $C_5$- or $C_6$cycloalkylenemethyl or -ethyl, phenyl, benzyl or 1-phenyleth-2-yl, $R_3$ is a direct bond, $C_1$–$C_{18}$alkylene, $C_5$- or $C_6$cycloalkyleneene, $C_6$–$C_{10}$arylene or $C_7$–$C_{12}$aralkylene, r is the number 0 or 1 and s is the number 0 or 1, and s is 0 if r is 0, $R_{23}$ and $R_{24}$ independently of one another are H, $C_1$–$C_6$alkyl, $C_6$–$C_{10}$aryl or $C_7$–$C_{12}$aralkyl, $R_{25}$ is H or the group —C(O)O—$R_{30}$, $R_{26}$ is H, $C_1$–$C_6$alkyl, $C_6$–$C_{10}$aryl or $C_7$–$C_{12}$aralkyl, $R_{27}$ is H, F, Cl, CN, $C_1$–$C_6$alkyl or $C_6$–$C_{10}$aryl, $R_{28}$ is H, $C_1$–$C_6$alkyl or —C(O)O—$R_{29}$, $R_{29}$ is H, $C_1$–$C_6$alkyl, $C_6$–$C_{10}$aryl, $C_7$–$C_{12}$aralkyl, imidazolyl, pyrrolidonyl, F, Cl, CN or the group $X_1$—$(R_1)_r$—$(X_2)_s$—H, and $R_{30}$ is H, K, Na, $C_1$–$C_{18}$alkyl, $C_1$–$C_{18}$hydroxyalkyl, cyclohexylene, cyclopentyl, cyclohexylenemethyl, phenyl, $C_1$–$C_4$alkylphenyl, benzyl or $C_1$–$C_4$alkylphenylbenzyl.

34. Photoinitiator according to claim 33, characterized in that the structural units of the formula X

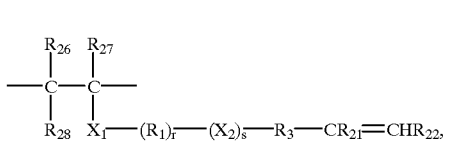

(X)

in which $X_1$ and $X_2$ independently of one another are a direct bond, or $X_2$ and $X_1$ together with the functional group independently of one another are —O—, —S—, —$NR_2$—, —C(O)—O—, —O—C(O)—, —O—C(O)—O—, —$SO_2$—O—, —O—$SO_2$—, —O—$SO_2$—O—, —$NR_2$—C(O)—, —C(O)—$NR_2$—, —$NR_2$—C(O)—O—, O—C(O)—$NR_2$—, —$NR_2$—C(O)—$NR_2$—, —$NR_2$—$SO_2$—, —$SO_2$—$NR_2$—, —$NR_2$—$SO_2$—O—, O—$SO_2$—$NR_2$—, $R_1$ is a bivalent bridging group, $R_2$ is H, $C_1$–$C_{12}$alkyl, $C_5$- or $C_6$cycloalkylene, $C_5$- or $C_6$cycloalkylenemethyl or -ethyl, phenyl, benzyl or 1-phenyleth2-yl, $R_3$ is a direct bond, $C_1$–$C_{18}$alkylene, $C_5$- or $C_6$cycloalkyleneene, $C_6$–$C_{10}$arylene or $C_7$–$C_{12}$aralkylene, r is the number 0 or 1 and s is the number 0 or 1, and s is 0 if r is 0;

$R_{21}$ is H or $C_1$–$C_4$alkyl, especially methyl;

$R_{22}$ is H, $C_1$–$C_{12}$alkyl, phenyl or benzyl; and $R_{26}$, $R_{27}$ and $R_{28}$ are as defined in claim 38;

replace from 0.1 to 99.9999 mol-% of the structural units of the formula VIII.

35. Photoinitiator according to claim 32, characterized in that from 0.1 to 100 mol-% of the structural units of the formula VIII are replaced by structural units of the formula IX,

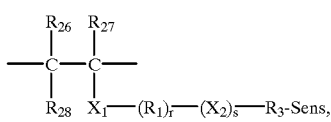

(IX)

in which $R_1$, $R_3$, $R_{26}$, $R_{27}$, $R_{28}$, $X_1$, $X_2$, r and s independently are as defined in claim 38, and Sens is the monovalent radical of a coinitiator, sensitizer or both.

36. Photoinitiator according to claim 32, characterized in that the polymer additionally comprises covalently bonded radicals of ethylenically unsaturated organic compounds as structural units of the formula X,

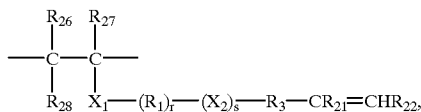
(X)

in which $X_1$ and $X_2$ independently of one another are a direct bond, or $X_2$ and $X_1$ together with the functional group independently of one another are —O—, —S—, —NR$_2$—, —C(O)—O—, —O—C(O)—, —O—C(O)—O—, —SO$_2$—O—, —O—SO$_2$—, —O—SO$_2$—O—, —NR$_2$—C(O)—, —C(O)—NR$_2$—, —NR$_2$—C(O)—O—, O—C(O)—NR$_2$—, —NR$_2$—C(O)—NR$_2$—, —NR$_2$—SO$_2$—, —SO$_2$—NR$_2$—, —NR$_2$—SO$_2$—O—, O—SO$_2$—NR$_2$— or —NR$_2$—SO$_2$—NR$_2$—, $R_1$ is a bivalent bridging group, $R_2$ is H, $C_1$–$C_{12}$alkyl, $C_5$- or $C_6$cycloalkylene, $C_5$- or $C_6$cycloalkylenemethyl or -ethyl, phenyl, benzyl or 1-phenyleth-2- yl, $R_3$ is a direct bond, $C_1$–$C_{18}$alkylene, $C_5$- or $C_6$cycloalkylene, $C_6$–$C_{10}$arylene or $C_7$–$C_{12}$aralkylene, r is the number 0 or 1 and s is the number 0 or 1, and s is 0 if r is 0;

$R_{21}$ is H or $C_1$–$C_4$alkyl, especially methyl;

$R_{22}$ is H, $C_1$–$C_{12}$alkyl, phenyl or benzyl; and $R_{26}$, $R_{27}$ and $R_{28}$ are as defined in claim 38.

37. Photoinitiator according to claim 32, characterized in that the polymer additionally comprises structural units of an at least difunctional monomer as crosslinking agent.

38. Photoinitiator according to claim 32, characterized in that the polymers comprise at least one structural unit of the formula XI,

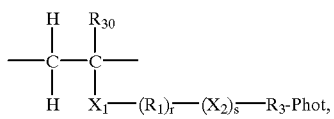
(XI)

in which $R_{30}$ is H or methyl and $X_1$, $X_2$, $R_1$, $R_3$, Phot, r and s are as defined in claim 38.

39. Photoinitiator according to claim 38, characterized in that the group —$X_1$—($R_1$)$_r$—($X_2$)$_s$—$R_3$- in the structural units of the formula XI is —C(O)—O—, —C(O)—O—$C_1$–$C_6$alkylene-O—, —C(O)—O—($C_2$–$C_6$alkylene-O)$_u$- where u is equal to a number from 2 to 10, C(O)—O—($C_2$–$C_6$alkylene-O)$_u$—$C_1$–$C_6$alkylene- where u is a number from 2 to 10 and —C(O)—O—$C_1$–$C_6$alkylene-S—.

40. Photoinitiator according to claim 38, characterized in that the radical Phot conforms to the formulae

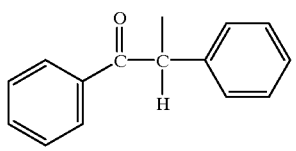

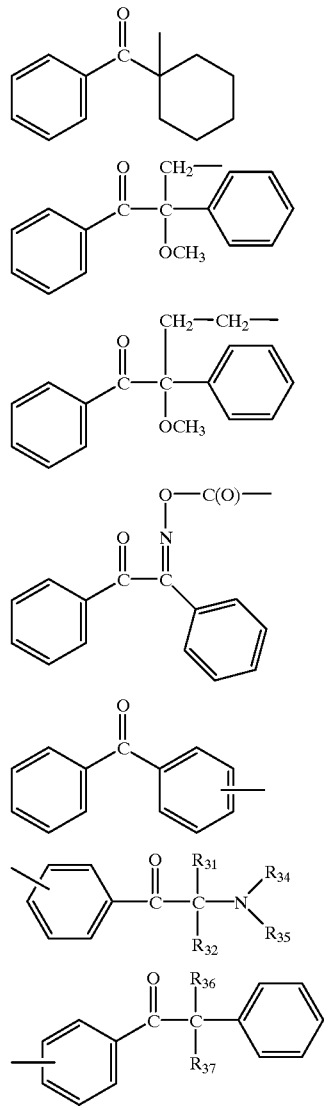

in which $R_{31}$ and $R_{32}$ independently of one another are $C_1$–$C_6$alkyl, $C_3$–$C_6$alkenyl, $C_5$- or $C_6$cycloalkylene, $C_7$–$C_{12}$aralkyl, or $R_{31}$ and $R_{32}$ together are tetra- or pentamethylene, $R_{34}$ and $R_{35}$ independently of one another are $C_1$–$C_{12}$alkyl, $C_5$- or $C_6$cycloalkylene, $C_7$–$C_{12}$-aralkyl or $R_{34}$ and $R_{35}$ together are tetramethylene, pentamethylene, —CH$_2$CH$_2$—O—CH$_2$CH$_2$— or —CH$_2$CH$_2$—N($C_1$–$C_4$alkyl)-CH$_2$CH$_2$, and $R_{36}$ and $R_{37}$ independently of one another are $C_1$–$C_6$alkoxy, $C_5$- or $C_6$cycloalkoxy, phenyloxy or phenyl-$C_1$–$C_4$alkoxy, or $R_{36}$ and $R_{37}$ together are $C_2$–$C_4$alkylenedioxyl or $C_2$–$C_4$alkenylenedioxyl.

41. Photoinitiator according to claim 38, characterized in that polymer in addition to the structural units of the formula XI also comprises identical or different structural units of the formula XII,

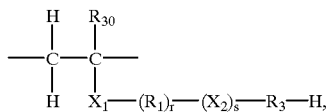
(XII)

in which $R_{30}$, $X_1$, $X_2$, $R_1$, $R_3$, r and s are as defined in claim 38.

42. Photoinitiator according to claim 38, characterized in that the polymer in addition to the structural units of the formula XI also comprises identical or different structural units of the formula XIII,

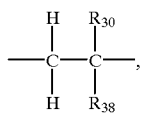
(XIII)

$R_{30}$ is H or methyl, and $R_{38}$ is H, $C_1$–$C_4$alkyl, $C_1$–$C_4$alkoxy, —CN, Cl, phenyl, pyrrolidonyl, pyridinyl, imidazolyl, —C(O)OR$_{39}$ or —C(O)—NR$_{40}$R$_{41}$, $R_{39}$ is H or $C_1$–$C_{18}$- and preferably $C_1$–$C_{12}$alkyl, and $R_{40}$ and $R_{41}$ independently of one another are H or $C_1$–$C_{12}$- and preferably $C_1$–$C_6$alkyl.

43. Photoinitiator according to claim 38, characterized in that polymer having structural units of the formula XI and, if desired, of the formulae XII and XIII is crosslinked with identical or different structural units of the formulae XIV or XV,

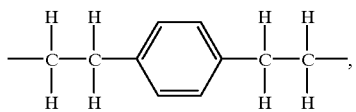
(XIV)

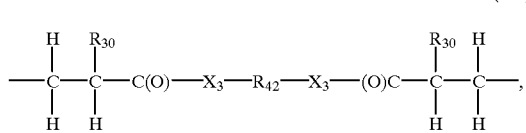
(XV)

in which $R_{30}$ is H or methyl, $X_3$ is —O— or —NH— or —N($C_1$–$C_4$alkyl)—, and $R_{42}$ is $C_2$–$C_{12}$- and preferably $C_1$–$C_6$alkylene, cyclohexyleneene, cyclohexyleneenedimethylene or $X_3$ is —O— and $R_{42}$ is $C_2$–$C_6$alkylene-($C_2$–$C_6$alkylene-O)$_{2\ to\ 20}$—$C_2$–$C_6$alkylene- .

44. Photoinitiator according to claim 38, characterized in that polymer comprising structural units of the formula XI in addition comprises identical or different ionogenic structural units of the formula XVI,

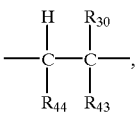
(XVI)

in which $R_{30}$ is H or methyl, and $R_{44}$ is H and $R_{43}$ is —C(O)OR$_{45}$, —SO$_3$R$_{45}$, —C$_6$H$_4$—COOR$_{45}$, —C$_6$H$_4$—SO$_3$R$_{45}$, —C$_6$H$_4$—R$_{46}$ or —C(O)—X$_4$—C$_2$-C$_6$alkylene-R$_{47}$, $R_{43}$ and $R_{44}$ independently of one another are —C(O)OR$_{45}$ or —C(O)—X$_4$—C$_2$-C$_6$alkylene-R$_{47}$, $R_{45}$ is an alkali metal, $R_{46}$ is an ammonium group or an ammonium methyl group, and $R_{47}$ is an ammonium group.

45. Photoinitiator according to claim 38, characterized in that the polymer having the structural units of the formula XI in addition comprises identical or different structural units of the formulae XVIII and XIX,

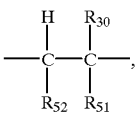
(XVIII)

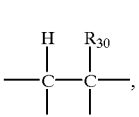
(XIX)

in which $R_{30}$ is H or methyl, $R_{52}$ is H and $R_{51}$ is —C(O)OH, —SO$_3$H, —C$_6$H$_4$—COOH, —C$_6$H$_4$—SO$_3$H, or $R_{51}$ and $R_{52}$ are —C(O)OH, $R_{54}$ is H and $R_{53}$ is pyridinyl, imidazolyl, pyrrolidonyl, —C$_6$H$_4$—R$_{55}$ or —C(O)—X$_4$—C$_2$-C$_6$alkylene-R$_{56}$, $X_4$ is —O—, —NH— or —N($C_1$–$C_4$alkyl), $R_{53}$ and $R_{54}$ independently of one another are —C(O)—X$_4$—C$_2$-C$_6$alkylene-R$_{56}$, $R_{55}$ is an amine group or an aminomethyl group, and $R_{56}$ is an amine group.

46. Photoinitiator according to claim 38, characterized in that the polymer having the structural units of the formula XI additionally comprises identical or different structural units of the formula XXI,

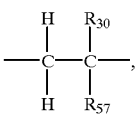
(XXI)

in which $X_4$ is —O—, —NH— or —N($C_1$–$C_4$alkyl)- , $R_{30}$ is H or methyl, and $R_{57}$ is —C$_6$H$_4$—CH$_2$Cl, —C$_6$H$_4$—CH$_2$Br, —C$_6$H$_4$—CH$_2$CH$_2$Cl, —C$_6$H$_4$—CH$_2$CH$_2$Br, —C(O)—X$_4$—

$C_2-C_6$alkyleneCl, —C(O)—$X_4$—$C_2$-$C_6$alkylene-Br, pyridinyl, imidazolyl, pyrrolidonyl, —$C_6H_4$—$R_{55}$ or —C(O)—$X_4$—$C_2$-$C_6$alkylene-$R_{56}$, $R_{56}$ is an amine group or an aminomethyl group, and $R_{56}$ is an amine group.

47. Photoinitiator according to claim 38, characterized in that the polymer having the structural units of the formula XI also comprises, as well as the additionally possible structural units, identical or different structural units with covalently bonded sensitizers or coinitiators of the formula XXII,

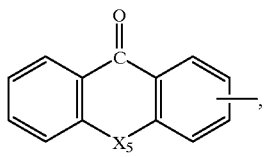
(XXII)

in which $R_{30}$ is H or methyl, $R_1$, $R_3$, $X_1$, $X_2$, r and s are as defined in claim 38, and Sens is a radical of the formula XXIII,

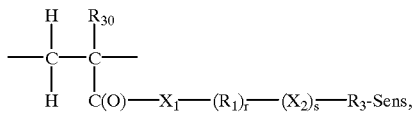
(XXIII)

in which $X_5$ is —O— and is preferably —S—.

48. Photopolymerizable and/or photocrosslinkable composition comprising (a) identical or different nonvolatile free-radically or cationically photopolymerizable or photocrosslinkable monomers and (b) a heterogeneous photoinitiator in microparticle form which consists of a finely divided substrate material to which identical or different photoinitiators are covalently bonded via functional groups of the substrate material wherein the substrate material is a plastic comprising a polymer with functional groups or a subsequently surface-modified polymer for introducing functional groups for the covalent bonding of the photoinitiators and the microparticles have a mean particle size of from 2 to 500 nm.

49. Photopolymerizable composition according to claim 48, characterized in that the photoinitiator is present in an amount of from 0.001 to 90% by weight, based on the composition.

50. Photopolymerizable composition according to claim 48, characterized in that the monomer comprises at least one polymerizable ethylenically unsaturated group.

51. Photopolymerizable composition according to claim 50, characterized in that the monomer is an substituted olefin.

52. Photopolymerizable composition according to claim 51, characterized in that the substituted olefin is selected from the group consisting of the acrylic esters, methacrylic esters and amides.

53. Photopolymerizable composition according to claim 52, characterized in that the acrylic and methacrylic esters and amides are those of the formula XXIV,

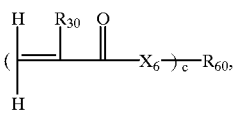
(XXIV)

in which $R_{30}$ is H or methyl, c is a number from 1 to 8, $X_6$ is one of the groups —O—, —NH— or —N($C_1$-$C_4$alkyl)-, and $R_{60}$ is a monovalent to octavalent hydrocarbon radical having 1 to 50 C atoms.

54. Photopolymerizable composition according to claim 51, characterized in that the substituents are selected from the group of $C_1$-$C_{18}$alkyl which is unsubstituted or substituted by —OH, —CN Cl, F, $C_1$-$C_{12}$alkoxy, —C(O)OH, —C(O)O—$C_1$-$C_{18}$alkyl, —C(O)O—$C_1$-$C_{18}$hydroxyalkyl, —C(O)Ocyclohexylene, —C(O)OCH$_2$cyclohexylene, —C(O)Ophenyl, —C(O)Obenzyl; $C_1$-$C_{12}$alkoxy which is unsubstituted or substituted by —OH, F, —Cl, $C_1$-$C_{12}$alkoxy, $C_1$-$C_{12}$hydroxyalkoxy, —C(O)OH, —C(O)O—$C_1$-$C_{18}$alkyl, —C(O)O—$C_1C_{18}$hydroxyalkyl, —C(O)Ocyclohexylene, —C(O)OCH$_2$cyclohexylene, —C(O)Ophenyl, —C(O)Obenzyl; Cl, —CN, pyridinyl, imidazolyl; phenyl which is unsubstituted or substituted by $C_1$-$C_4$alkyl, $C_1$-$C_4$alkoxy, —OH, —CN, halogen, —C(O)OH, —C(O)O—$C_1$-$C_{18}$alkyl, —C(O)O—$C_2$-$C_{18}$hydroxyalkyl, —C(O)Ocyclohexylene, —C(O)—OCH$_2$cyclohexylene, —C(O)Ophenyl, —C(O)Obenzyl —SO$_3$H, —SO$_3$-$C_1$-$C_{18}$alkyl, chloromethyl, bromomethyl, —NH$_2$, primary or secondary amino having 1 to 20 C atoms, primary or secondary aminomethyl having 1 to 20 C atoms; and —C(O)OH, —C(O)—O—$C_1$-$C_{20}$alkyl or -hydroxyalkyl, —C(O)Ocyclohexylene, —C(O)OCH$_2$cyclohexylene, —C(O)Ophenyl, —C(O)Obenzyl —C(O)—O—($C_aH_{2a}$O)—H with a equal to a number from 2 to 6 and b equal to a number from 2 to 12; and —C(O)—NR$_{58}$R$_{59}$, in which R$_{58}$ and R$_{59}$ independently of one another are H, $C_1$-$C_{12}$alkyl, $C_1$-$C_{12}$hydroxyalkyl, $C_1$-$C_6$alkyl-C(O)OH, $C_1$-$C_6$alkyl-C(O)O—$C_1$-$C_{12}$alkyl or —($C_aH_{2a}$O)—H where a is equal to a number from 2 to 6 and b is equal to a number from 2 to 12.

55. Photopolymerizable composition according to claim 48, characterized in that at least diethylenically unsaturated organic compounds are additionally present.

56. Photopolymerizable composition according to claim 55, characterized in that the amount of the compound are at least 0.1% by weight, based on the monomers.

57. Photopolymerizable composition according to claim 48, characterized in that it comprises as formulating auxiliaries solvents, antioxidants, light stabilizers, plasticizers, dyes, pigments, fillers, including reinforcing fillers, lubricants, surfactants and/or mold release auxiliaries.

58. Coated substrate material, characterized in that a coat of a composition according to claim 48 has been applied to a substrate.

59. Process for preparing coated materials or relief images on substrates, in which a composition according to claim 48 with or without solvent is applied as a coat to a substrate, the solvent present in the composition is removed, the coat is polymerized by irradiation, or the coat is irradiated through a photomask and then the non- irradiated areas are removed with a solvent.

60. Process for polymerizing or crosslinking a photopolymedzable and/or photocrosslinkable composition comprising (a) identical or different nonvolatile free-radically or catonically photopolymerizable or photocrosslinkable monomers and (b) a heterogenous photoinitiator in microparticle form which consists of a finely divided substrate material to which identical or different photoinitiators are covalently bonded via functional groups of the substrate material wherein the substrate material is a plastic comprising a polymer with functional groups or a subsequently surface-modified polymer for introducing functional troups for the covalent bonding of the photoinitiators and the microparticles have a mean particle size of from 2 to 500 nm, in which process the said composition is irradiated with actinic radiation.

61. Polymers formed from identical or different nonvolatile free-radically or cationically photopolymerizable or photocrosslinkable monomers, characterized in that they comprise microparticles to which identical or different cleavage products of photoinitiators, or photoinitiators and sensitizers or coinitiators, are covalently bonded.

* * * * *